United States Patent
Sharifi et al.

(10) Patent No.: US 12,204,989 B2
(45) Date of Patent: Jan. 21, 2025

(54) CRYOGENIC COOLING SYSTEM

(71) Applicant: The Boeing Company, Chicago, IL (US)

(72) Inventors: Fred Sharifi, Huntington Beach, CA (US); John R. Lowell, Fairfax, VA (US)

(73) Assignee: The Boeing Company, Chicago, IL (US)

( * ) Notice: Subject to any disclaimer, the term of this patent is extended or adjusted under 35 U.S.C. 154(b) by 505 days.

(21) Appl. No.: 17/643,868

(22) Filed: Dec. 13, 2021

(65) Prior Publication Data

US 2023/0186127 A1 Jun. 15, 2023

(51) Int. Cl.
| | |
|---|---|
| *G06N 10/00* | (2022.01) |
| *G06F 1/20* | (2006.01) |
| *H05K 7/20* | (2006.01) |
| *H10N 69/00* | (2023.01) |

(52) U.S. Cl.
CPC ......... *G06N 10/00* (2019.01); *H05K 7/20372* (2013.01); *G06F 1/20* (2013.01); *H10N 69/00* (2023.02)

(58) Field of Classification Search
CPC ........ G06N 10/00; G06N 10/40; H10N 69/00; B82Y 10/00; H05K 7/20372; G06F 1/20; F25B 9/12
See application file for complete search history.

(56) References Cited

U.S. PATENT DOCUMENTS

| | | | | |
|---|---|---|---|---|
| 6,027,077 A | * | 2/2000 | Eller | B64G 1/50 244/171.8 |
| 2013/0045870 A1 | * | 2/2013 | Rogers | B65D 88/125 29/890.035 |
| 2017/0268792 A1 | * | 9/2017 | Costakis | F24F 11/85 |
| 2020/0209330 A1 | * | 7/2020 | Popescu | F25B 9/10 |
| 2021/0326739 A1 | | 10/2021 | Jeffrey | |

FOREIGN PATENT DOCUMENTS

| | | |
|---|---|---|
| EP | 3678066 A1 | 7/2020 |
| GB | 2493553 A | 2/2013 |
| WO | 2011143398 A1 | 11/2011 |

OTHER PUBLICATIONS

European Patent Office Extended Search Report, dated May 22, 2023, regarding Application No. EP22211034.8, 8 pages.

* cited by examiner

*Primary Examiner* — Lionel Nouketcha
(74) *Attorney, Agent, or Firm* — Yee & Associates, P.C.

(57) ABSTRACT

A method, apparatus, and system include a cooling system comprising a payload refrigeration unit, control refrigeration unit, and a signal interface. The payload refrigeration unit has a set of payload cooling components that operate to cool a payload. The control refrigeration unit has a set of control circuit cooling components in a control circuit. The signal interface connecting the payload is located in the payload refrigeration unit in the control circuit located in the control refrigeration unit.

20 Claims, 17 Drawing Sheets

CRYOGENIC COOLING SYSTEM

BACKGROUND INFORMATION

1. Field

The present disclosure relates generally to cooling systems and in particular, to cryogenic cooling systems for computer systems. Still more particularly, the present disclosure relates to a method, apparatus, and system for cooling quantum computing systems.

2. Background

In quantum computing, one approach implements the quantum computer systems using superconducting electronics. For example, devices in quantum computers such Josephson effect devices or superconducting quantum interference devices (SQUIDs). These components can be used to implement devices such as quantum bits (qubits) and quantum gates. The advantages of using superconducting electronics in quantum computers include scalability, size, and relative simplicity in implementing gate operations as compared to other technologies.

With superconducting electronics, cooling from cryogenic systems is needed for realistic operation of devices in quantum computer systems implemented using superconducting electronics. For example, superconducting quantum interference devices operate at milli-Kelvin (mK) temperatures to operate. Maintaining quantum computer systems at these temperatures can be challenging using current cooling techniques because insufficient cooling power is present to maintain a desired temperature for these systems.

Therefore, it would be desirable to have a method and apparatus that take into account at least some of the issues discussed above, as well as other possible issues. For example, it would be desirable to have a method and apparatus that overcome a technical problem with cooling quantum computer systems.

SUMMARY

An embodiment of the present disclosure provides a cooling system comprising a payload refrigeration unit, control refrigeration unit, and a signal interface. The payload refrigeration unit has a set of payload cooling components that operate to cool a payload. The control refrigeration unit has a set of control circuit cooling components in a control circuit. The signal interface connecting the payload located in the payload refrigeration unit to the control circuit located in the control refrigeration unit.

Another embodiment of the present disclosure provides a cryogenic cooling system comprising a payload refrigeration unit, a control refrigeration unit, and a signal interface. The payload refrigeration unit comprises a payload enclosure and a dilution cooler within the payload enclosure. The dilution cooler cools a payload when the payload is thermally connected to the dilution cooler and is located within the payload enclosure. The control refrigeration unit comprises a control enclosure and a set of coolers connected to the control enclosure. The set of coolers cools a control circuit when the control circuit is thermally connected to the set of coolers and is located within the control enclosure. The signal interface connects the control circuit to the payload, enabling signals to be exchanged between the control circuit and the payload during an operation of the control circuit.

Yet another embodiment of the present disclosure provides a method for controlling a quantum circuit environment. A set of quantum circuits is operated in a payload refrigeration unit comprising a payload enclosure and a dilution cooler within the payload enclosure. The set of quantum circuits is thermally connected to the dilution cooler. The set of quantum circuits is cooled in the payload refrigeration unit during operation of the set of quantum circuits using the dilution cooler. A control circuit is operated in a control refrigeration unit comprising a control enclosure and a set of coolers connected to the control enclosure. The control circuit is thermally connected to set of coolers within the control enclosure and operates to control the set of quantum circuits. The circuit in the control refrigeration unit is cooled during an operation of the control circuit using the set of coolers.

The features and functions can be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the illustrative embodiments are set forth in the appended claims. The illustrative embodiments, however, as well as a preferred mode of use, further objectives and features thereof, will best be understood by reference to the following detailed description of an illustrative embodiment of the present disclosure when read in conjunction with the accompanying drawings, wherein:

DETAILED DESCRIPTION

Figure 1:
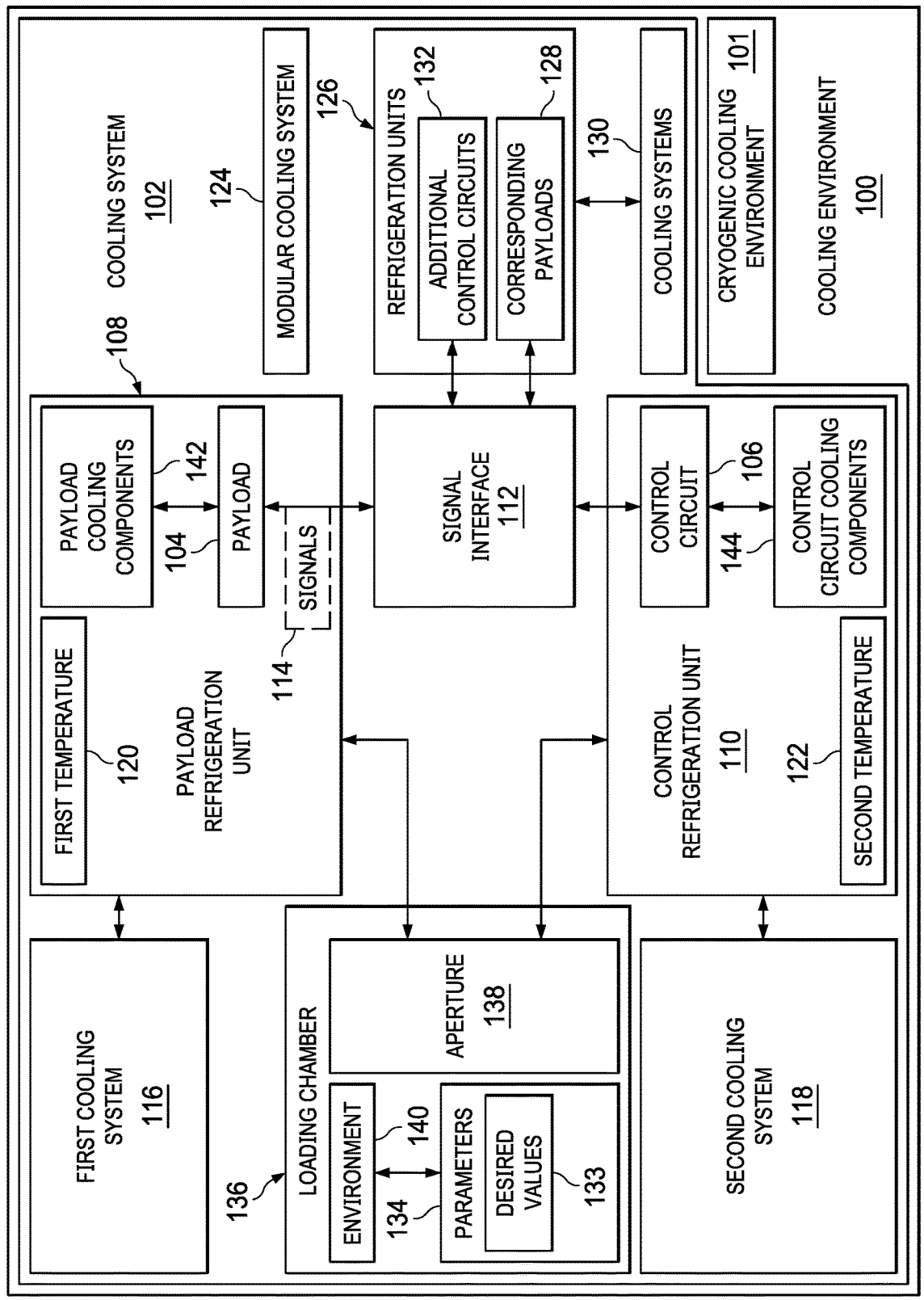
FIG. 1 is an illustration of a block diagram of a cooling environment in accordance with an illustrative embodiment.

The illustrative embodiments recognize and take into account one or more different considerations. This inability to cool quantum computing systems to a desired temperature level for operation can be caused by the heat load imposed by electronic accessories used for the operation of quantum computers. For example, the illustrative embodiments recognize and take into account that prototype superconducting quantum computer systems have used standard dilution refrigeration technology to achieve the milli-kelvin temperatures needed to cool superconducting quantum devices. The illustrative embodiments recognize and take into account that a dilution refrigeration system is a cryogenic device that provides continuous cooling to temperatures as low as 2 mK, with no moving parts in the low-temperature region. The illustrative embodiments recognize and take into account that in the dilution refrigeration system, the cooling power is provided by the heat of mixing of the Helium-3 and Helium-4 isotopes. The illustrative embodiments recognize and take into account that these superconducting quantum devices used in quantum computer systems do not dissipate much power.

The illustrative embodiments recognize and take into account that control circuits are used in the quantum computer systems to control operation of the superconducting quantum devices. As the quantum computer systems increase in complexity, the illustrative embodiments recognize and take into account that increased thermal loads are present. The illustrative embodiments recognize and take into account that these increased thermal loads can be caused by the increase in complexity in superconducting quantum devices and the wiring requirements connecting the control circuits to the superconducting quantum devices. The illustrative embodiments recognize and take into account that dilution refrigeration systems currently used are unable to provide sufficient cooling with these increased thermal loads.

The illustrative embodiments recognize and take into account that one solution involves placing the control circuits onto the supporting structure on the dilution refrigeration systems for the superconducting quantum devices. The illustrative embodiments recognize and take into account the placement can reduce the size of the quantum computer system and that speed and flexibility can be increased.

The illustrative embodiments recognize and take into account that this placement of the control electronics increases the issue of heat. The illustrative embodiments recognize and take into account that in addition to the thermal loads from the cables, the control circuits are implemented using silicon and have greater heat dissipation that cannot be handled by current dilution refrigeration systems.

The illustrative embodiments recognize and take into account that one approach to resolve this issue involves moving the control circuits on-board the cryogenic systems. The illustrative embodiments recognize and take into account that this change in placement of the control circuits can be involve moving the semiconductor-based control circuits onto the supporting structure of the dilution refrigeration system. The illustrative embodiments recognize and take into account that a dilution refrigeration system can be a 1K platform or similar platforms, which serves to condense and cool a circulating He3-He4 mixture.

The illustrative embodiments recognize and take into account that this "add-on" approach of placing control electronics onto a platform designed for another purpose creates issues. The illustrative embodiments recognize and take into account that one issue with this approach is that the power dissipation of the semiconductor control circuits can be at the level of several watts and can exceed the cooling power of 1K platforms of the largest dilution refrigeration systems. Additionally, the illustrative embodiments recognize and take into account that the vacuum environment of the 1K platform does not allow for uniform cooling of these control circuits.

The illustrative embodiments recognize and take into account that choosing a platform that limits operation of the superconducting circuits to 1K cooling power can be a significant self-imposed constraint of the design. For example, the illustrative embodiments recognize and take into account that this operating temperature may not be optimal or necessary for the superconducting electronics. The illustrative embodiments recognize and take into account that the low temperature creates issues with undesirable variability in the performance of the basic transistors, where single defect levels may dominate the characteristics of individual transistors differently in the control circuits.

The illustrative embodiments also recognize and take into account that dilution refrigeration technology is a platform focused on the needs of the scientific research community and is not scalable and does not offer a fast turn-around of devices required for product validation.

As a result, the illustrative embodiments recognize and take into account that current quantum computer system architecture are unable to provide optimal performance. Thus, the illustrative embodiments provide a method, apparatus, and system for cryogenic cooling that can resolve one or more of these issues. In one illustrative example, a modular cooling system comprises a payload refrigeration unit having a payload and a control refrigeration unit having a control circuit. The modular cooling system also can include a signal interface connecting the payload located in the payload refrigeration unit to the control circuit located in control refrigeration unit. In this illustrative example, a first cooling system is connected to the payload refrigeration unit during operation of the first refrigeration system and a second cooling system is connected to the control refrigeration unit during an operation of the control refrigeration unit.

With reference now to the figures in particular with reference to FIG. 1, an illustration of a block diagram of a cooling environment is depicted in accordance with an illustrative embodiment. In this illustrative example, cooling environment 100 is an environment in which cooling system 102 can operate to cool items such as payload 104 and control circuit 106. In this illustrative example, cooling environment 100 can be cryogenic cooling environment 101. In this environment, temperatures can be between 2 K and 300 K.

In this illustrative example, cooling system 102 comprises a number of different components. As depicted, cooling system 102 comprises payload refrigeration unit 108, control refrigeration unit 110, and signal interface 112.

As used herein, a "number of" when used with reference to items means one of more items. For example, a number of different components is one or more different components.

As depicted, payload refrigeration unit 108 can have payload 104 and control refrigeration unit 110 can have control circuit 106. In other words, payload refrigeration unit 108 can be thermally connected to payload 104 and payload 104 be placed within payload refrigeration unit 108. Control refrigeration unit 110 can be thermally connected to control circuit 106, and control circuit 106 can also be placed within control refrigeration unit 110.

Payload 104 can take a number of different forms. For example, payload 104 can be selected from at least one of a quantum computing circuit, a quantum computing chip, a superconducting circuit, a sensor system and a low temperature material, a superconducting material, an infra-red imaging system, a topological material with electronic properties that are distinct between a surface of the topological material and an interior of topological material and a sensor system, or some other suitable component or set of components.

As used herein, a "set of" when used with reference to items means one or more items. For example, a set of components is one or more components. In other words, payload 104 can be comprised of one or more components. For example, payload 104 can be a quantum computing circuit and a sensor system. In another example, payload 104 can be a quantum computing circuit, an infrared imaging system, and a carrier with connectors.

As depicted, control circuit 106 can be used to control the operation of components in payload 104. Control circuit 106 can control the operation of one or more superconducting circuits that form payload 104. As another illustrative example, control circuit 106 can receive information from a sensor system monitoring a low temperature material in payload 104.

In this illustrative example, signal interface 112 connects control circuit 106 to payload 104. This connection provided using signal interface 112 enables the communication of signals 114 between control circuit 106 and payload 104. For example, signal interface 112 enables sending signals 114 from control circuit 106 to payload 104, sending signals 114 from at least one of payload 104 or control circuit 106.

In this illustrative example, signals 114 can take a number of different forms. For example, signals 114 can be selected from at least one of an electrical signal, an optical signal, or some other suitable type of signal. Signals 114 can encode at least one of data, commands, or other information.

As used herein, the phrase "at least one of," when used with a list of items, means different combinations of one or more of the listed items can be used, and only one of each item in the list may be needed. In other words, "at least one of" means any combination of items and number of items may be used from the list, but not all of the items in the list are required. The item can be a particular object, a thing, or a category.

For example, without limitation, "at least one of item A, item B, or item C" may include item A, item A and item B, or item B. This example also may include item A, item B, and item C or item B and item C. Of course, any combinations of these items can be present. In some illustrative examples, "at least one of" can be, for example, without limitation, two of item A; one of item B; and ten of item C; four of item B and seven of item C; or other suitable combinations.

As depicted, payload refrigeration unit 108 and control refrigeration unit 110 operate independently of each other. In this illustrative example, a connection is present between first cooling system 116 and payload refrigeration unit 108 during operation of payload refrigeration unit 108. A connection is present between second cooling system 118 and control refrigeration unit 110 during operation of control refrigeration unit 110.

These cooling systems provide at least one of power, coolant, or other resources needed by cooling components in the refrigeration units. As depicted, when connected to payload refrigeration unit 108, first cooling system 116 enables a set of payload cooling components 142 to cool payload 104 in payload refrigeration unit 108. When connected to control refrigeration unit 110, second cooling system 118 enables a set of control circuit cooling components 144 to cool control circuit 106 in control refrigeration unit 110.

In this illustrative example, payload refrigeration unit 108 can control at least one of heating or cooling payload 104 independently of control refrigeration unit 110 heating or cooling control circuit 106. In other words, payload refrigeration unit 108 can be at first temperature 120 while the control refrigeration unit 110 can be at second temperature 122. For example, first temperature 120 in payload refrigeration unit 108 can be as low as 2 m mK, and second temperature 122 in control refrigeration unit 110 is in a temperature range from about 2 K to about room temperature.

In this illustrative example, cooling system 102 can be modular cooling system 124. Additional refrigeration units can be used in addition to payload refrigeration unit 108 and control refrigeration unit 110. For example, a set of refrigeration units 126 can be present. These refrigeration units can be at least one of a set of payload refrigeration units or a set of control refrigeration units.

For example, a set of refrigeration units 126 can have a set of corresponding payloads 128. The set of corresponding payloads 128 located in the set of refrigeration units 126 can be connected to control circuit 106 in payload refrigeration unit 108 by signal interface 112. This set of refrigeration units 126 can also be cooled by a set of cooling systems 130 in which each refrigeration unit in the set of refrigeration units 126 is connected to a separate cooling system in cooling systems 130 from another refrigeration unit in the set of refrigeration units 126.

In this illustrative example, each corresponding payload in the set of corresponding payloads 128 can be connected to the set of control circuits in control refrigeration unit 110 by signal interface 112.

In one illustrative example, signal interface 112 can be thermally anchored within each refrigeration unit. This thermal anchoring can reduce heat from thermally conducting between the two refrigeration units. For example, heat generated by control circuit 106 in control refrigeration unit 110 can be prevented from traveling through signal interface 112 to payload 104 and payload refrigeration unit 108. For example, if signal interface 112 includes heat generating components, those components can be thermally anchored as the unit has sufficient cooling power. Use of a superconductor cable or similar low-thermal conductivity materials, can ensure heat generated by control circuit 106 does not travel through the superconducting wires or cables into payload refrigeration unit 108.

In another illustrative example, the set of refrigeration units 126 can contain a set of additional control circuits 132. The set of additional control circuits 132 can be connected to payload 104 payload refrigeration unit 108.

In another illustrative example, the set of refrigeration units 126 can include at least one of a corresponding payload or a corresponding control circuit that can be connected to refrigeration units present in cooling system 102.

In another illustrative example, cooling system 102 can have an additional feature that enables at least one of control circuit 106 or payload 104 to be controlled to a set of desired values 133 for a set of parameters 134 prior to introduction into a refrigeration unit.

For example, cooling system 102 can include loading chamber 136 having aperture 138. Aperture 138 can be connected to payload refrigeration unit 108. Aperture 138 can be opened and closed in this illustrative example.

As depicted, environment 140 in loading chamber 136 can be adjusted to a set of desired values 133 for a set of parameters 134 prior at least one of opening aperture 138 and moving payload 104 from payload refrigeration unit 108 into loading chamber 136, opening aperture 138 and moving payload 104 from loading chamber 136 into payload refrigeration unit 108, removing payload 104 from loading chamber 136, or some other suitable operation with respect to payload 104. In the illustrative example, the set of parameters 134 can be selected from at least one of a temperature, a vacuum, a pressure or other suitable parameter. The set of parameters 134 can be selected as parameters that have a set of desired values 133 that should match or be within a range or tolerance level with respect to the set of values for the same set of parameters within a refrigeration unit, such as payload refrigeration unit 108.

In another illustrative example, loading chamber 136 can have aperture 138 connected to control refrigeration unit 110. With this configuration, environment 140 in loading chamber 136 can be adjusted to the set of desired values 133 to the set parameters 134 prior at least one of opening aperture 138 and moving control circuit 106 from control refrigeration unit 110 into loading chamber 136, opening aperture 138 and moving control circuit 106 from loading chamber 136 into control refrigeration unit 110, removing control circuit 106 from loading chamber 136, or some other suitable operation with respect to control circuit 106.

With the use of loading chamber 136, cooling or warming of at least one of payload refrigeration unit 108 and control refrigeration unit 110 can be avoided, enabling reducing the amount of time needed to change components such as payload 104 and control circuit 106. As another example, a vacuum can be maintained in at least one of payload refrigeration unit 108 for control refrigeration unit 110 when introducing or removing components such as payload 104 and control circuit 106. Loading chamber 136 enables reduces the time needed to components such as payload 104 and control circuit 106. As result, testing can be performed more quickly when component changes occur.

Figure 2:
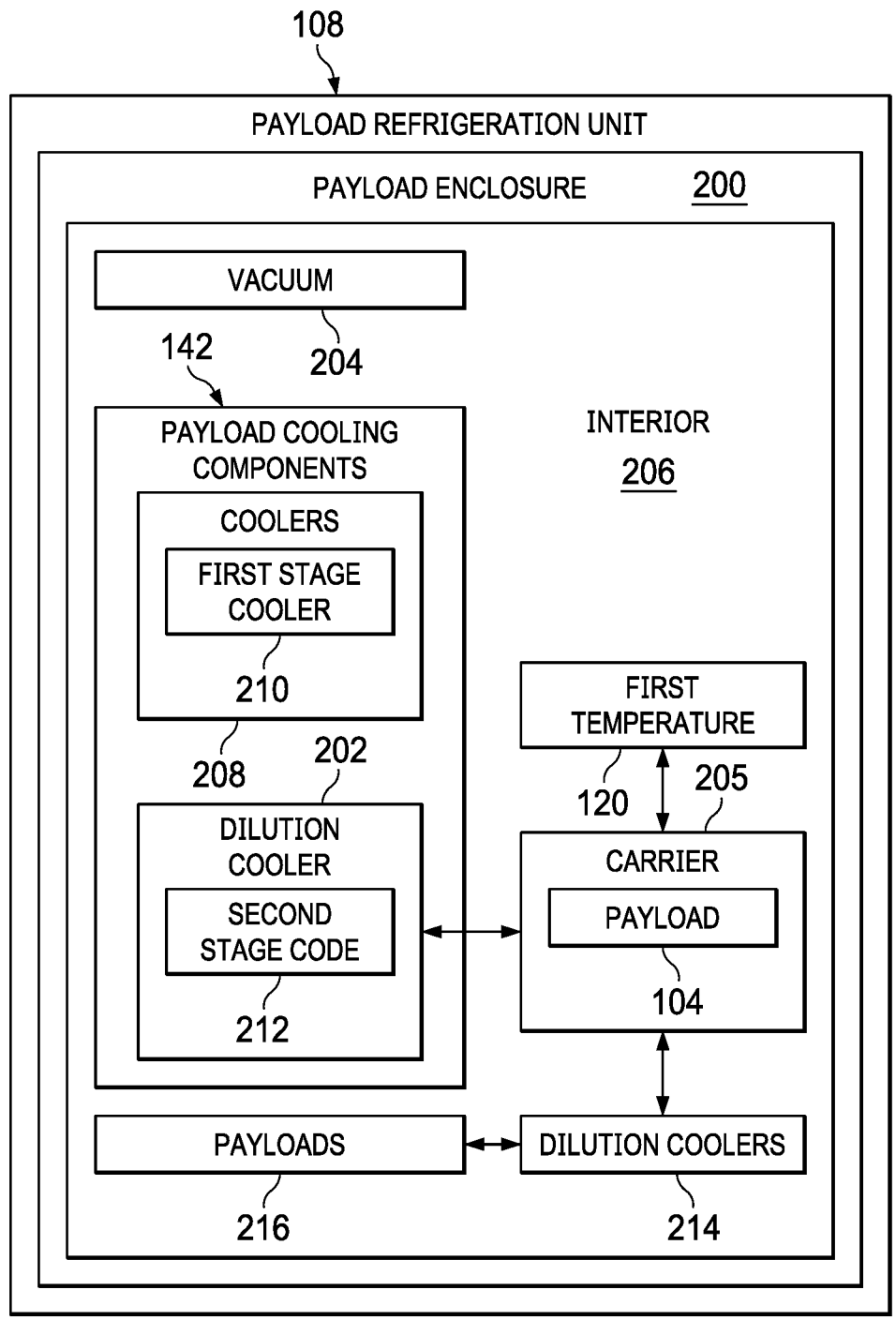
FIG. 2 is an illustration of a block diagram of a payload refrigeration unit in accordance with an illustrative embodiment.

With reference next to FIG. 2, an illustration of a block diagram of a payload refrigeration unit is depicted in accordance with an illustrative embodiment. In this figure, an example of one implementation for payload refrigeration unit 108 is shown.

In this illustrative example, payload refrigeration unit 108 comprises payload enclosure 200 and the set of payload cooling components 142 comprises dilution cooler 202.

Payload enclosure 200 can be any structure in which payload 104 can be placed. In one illustrative example, payload enclosure 200 is vacuumable such that vacuum 204 can be present within payload enclosure 200 when payload 104 is located in payload enclosure 200. Vacuum 204 can be set in any desirable level needed for payload 104.

As depicted, payload 104 be located on or inside of carrier 205. Carrier 205 can take a number of forms. For example, carrier 205 can be a platform, a puck, a housing, or some other suitable structure for holding or supporting payload 104.

In this illustrative example, dilution cooler 202 can cool at least one of interior 206 in payload enclosure 200 or payload 104 in payload enclosure 200 to first temperature 120 such as 2 mK. In one illustrative example, dilution cooler 202 can cool payload 104 when payload 104 is thermally connected to dilution cooler 202 within payload enclosure 200. In this illustrative example, dilution cooler 202 can also be referred to as a 3He/4He dilution refrigerator in which cooling towers provided by the heat of mixing helium-3 and helium-4 isotopes.

In this illustrative example, the payload including a set of payload cooling components 142 can also include a set of coolers 208. The set of coolers 208 can cool interior 206. When the set of coolers 208 is present, the set of coolers 208 can be first stage cooler 210. The set of coolers 208 can cool interior 206 within payload enclosure 200 to temperature such as 40 k or some other suitable temperature. The set of coolers 208 can be a set of first coolers and a set of second coolers that are selected from at least one of a pulse tube cooler, a Stirling cooler, a Gifford-McMahon (GM) cooler, a Joule-Thomson (JT) cooler, a liquid helium heat exchanger, a supercritical liquid cooler, or some other suitable type of cooling device or system.

In this example, dilution cooler 202 can be second stage cooler 212. As second stage cooler 212, dilution cooler 202 can cool payload 104 to first temperature 120 such as 2 mk. The use of first stage cooler 210 can reduce the amount of cooling power needed by dilution cooler 202 and second stage cooler 212 to cool payload 104 to first temperature 120.

In another illustrative example, payload refrigeration unit 108 can comprise a set of dilution coolers 214 that can operate to cool at least one of payload 104 or a set of payloads 216. When more than one payload is present in the set of payloads 216, the set of payloads 216 can be the same type for different types of payloads.

Figure 3:
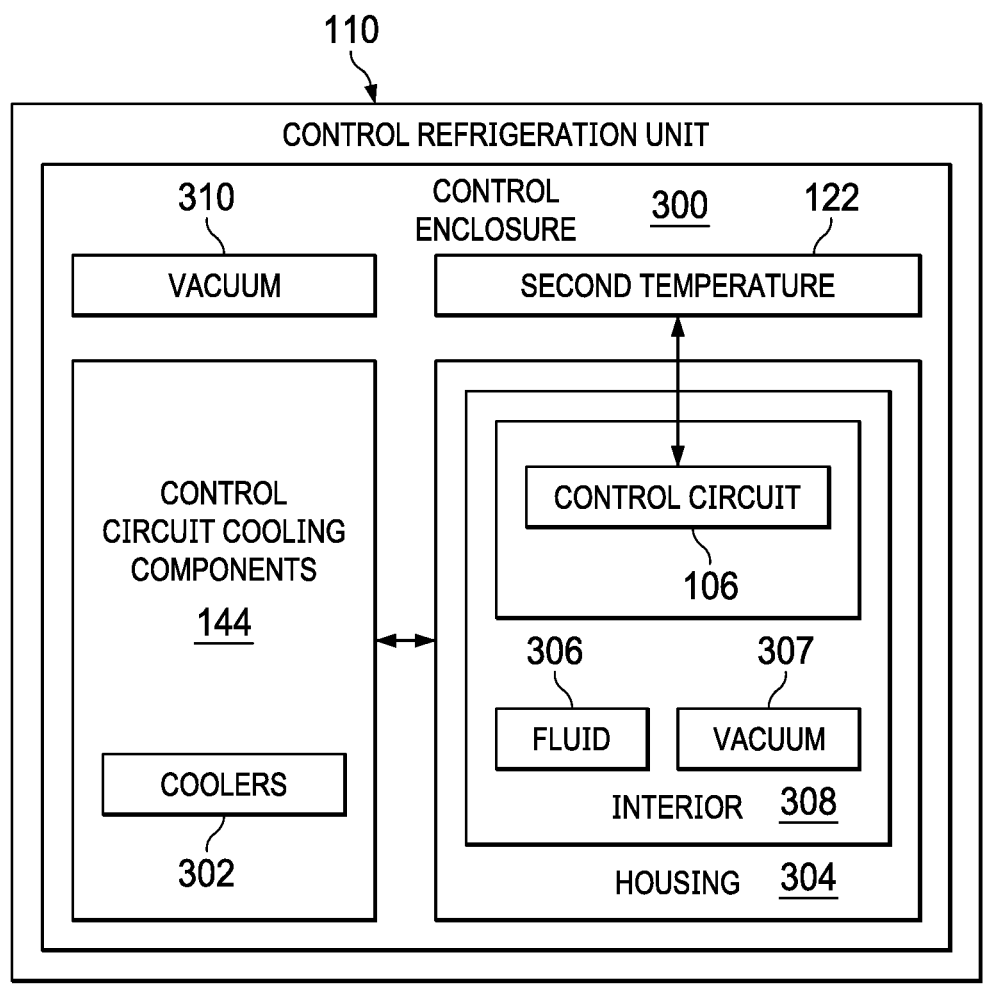
FIG. 3 is an illustration of a block diagram of a control refrigeration unit in accordance with an illustrative embodiment.

Turning next to FIG. 3, illustration of a block diagram of a control refrigerator unit is depicted in accordance with an illustrative embodiment. In this figure, an example of one implementation for control refrigeration unit 110 is shown.

In this illustrative example, control refrigeration unit 110 comprises control enclosure 300. The set of control circuit cooling components 144 in control refrigeration unit 110 comprises set of coolers 302. The set of coolers 302 can cool control circuit 106 located within control enclosure 300.

In this illustrative example, the set of coolers 302 can be thermally connected to control circuit 106. The set of coolers 302 can cool the set of control circuits to second temperature 122 such as from about 2 K two about room temperature.

As depicted, control circuit 106 is located in housing 304. In this illustrative example, a set of control circuits are thermally connected to the set of coolers 302 through housing 304. In other words, housing 304 is comprised of one or more materials that are thermally conductive.

In this illustrative example, housing 304 can be sealed and fluid 306 can be present in interior 308 of within housing 304. For example, fluid 306 can be an inert gas such as helium. In another example, vacuum 307 can be present in housing 304.

Additionally, control enclosure 300 is vacuumable such that vacuum 310 can be present within control enclosure 300 when control circuit 106 is located in control enclosure 300. Vacuum 310 can be set in any desirable level for the operation of control circuit 106.

In one illustrative example, one or more technical solutions are present that overcome a technical problem with cooling devices or components as components for quantum computer systems. As a result, one or more technical solutions can provide a technical effect of providing a desirable cooling for payload such as quantum circuits that may be tested using control circuits. For example, one or more technical solutions involved independently cooling control circuits and the payload in separate units. For example, when cooling is performed at cryogenic temperatures, the environment for the control circuits can be separated from the environment in which the quantum computing circuits are located. As result, one or more illustrative examples provide a technical solution that enables independent control access to control circuits and payloads, such as quantum computing circuits. This separation control enables increasing operational capability of a cooling system, especially cooling system that employs a cryogenic environment.

In another illustrative example, more technical solutions include using a loading chamber to reduce the time needed to change out at least one of the circuit boards.

The illustration of cooling environment 100 in FIG. 1 is not meant to imply physical or architectural limitations to the manner in which an illustrative embodiment may be implemented. Other components in addition to or in place of the ones illustrated may be used. Some components may be unnecessary. Also, the blocks are presented to illustrate some functional components. One or more of these blocks may be combined, divided, or combined and divided into different blocks when implemented in an illustrative embodiment.

For example, although cooling system 102 can operate to provide cryogenic cooling environment 101, cooling system 102 can operate to provide cooling other temperature ranges. For example, when payload 104 in quantum computing circuit comprises room temperature superconducting materials, then payload refrigeration unit 108 in cooling system 102 can operate to cool payload 104 to a temperature such as, for example, 300 degrees k or less.

Figure 4:
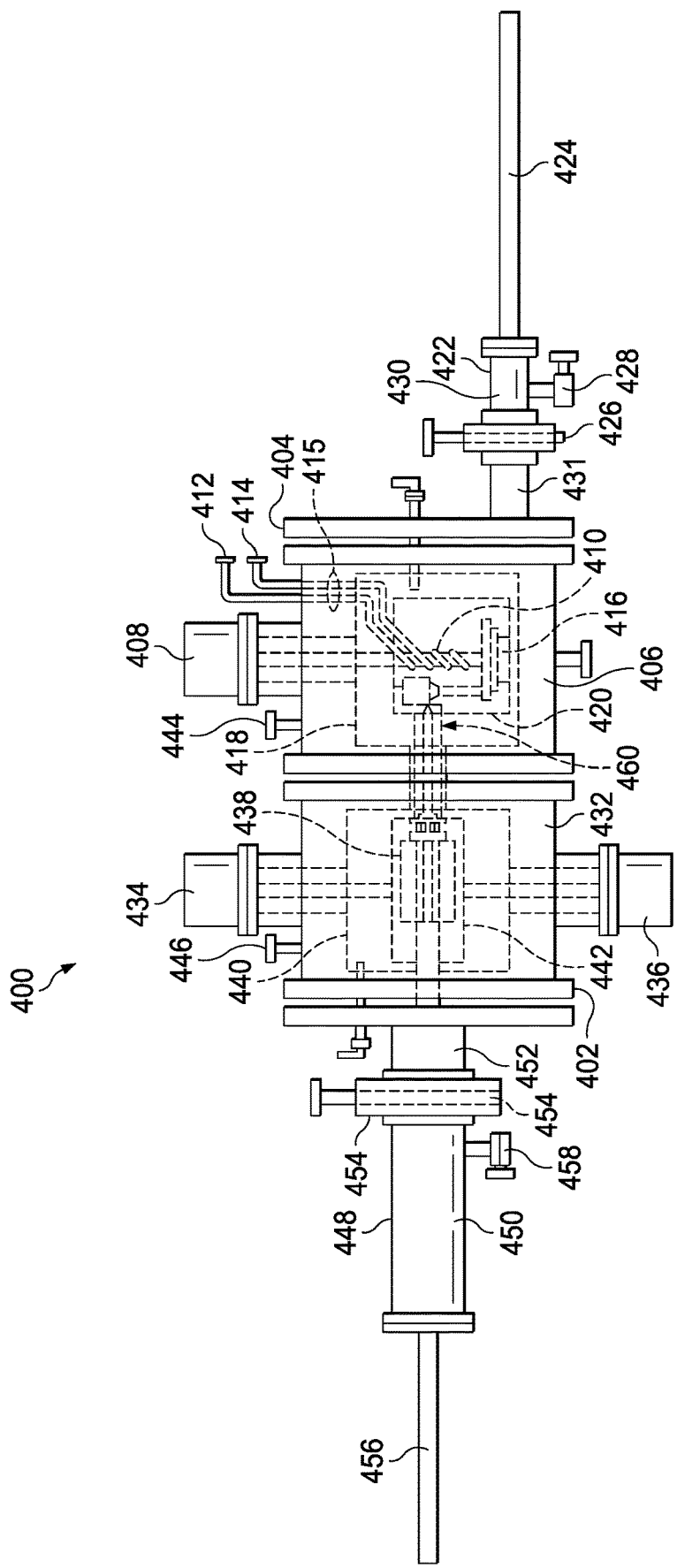
FIG. 4 is an illustration of schematic diagram of side view of a cooling system in accordance with an illustrative embodiment.

With reference now to FIG. 4, an illustration of schematic diagram of side view of a cooling system is depicted in accordance with an illustrative embodiment. Cooling system 400 is an example of an implementation for cooling system 102 in FIG. 1 shown in block form. In this illustrative example, cooling system 400 can be considered to be a modular cooling system because it comprises separate refrigeration units for different components. As depicted, cooling system 400 comprises payload refrigeration unit 402 and control refrigeration unit 404.

As depicted, payload refrigeration unit 402 has payload enclosure 406. A set of pulse tube coolers is connected to payload enclosure 406. Pulse tube cooler 408 can be seen in this side view of cooling system 400. As depicted, pulse tube cooler 408 extends into the interior of payload enclosure 406 as shown by the dashed lines for portion of pulse tube cooler 408 extending into the interior of payload enclosure 406. Pulse tube cooler 408 is an example of an implementation for coolers 208 in FIG. 2. The set of pulse tube coolers is a first stage coolers for cooling system 400. These pulse tube coolers can operate to cool the interior of payload enclosure 406 to a first temperature. A second stage cooler can further cool the interior of enclosure to a second temperature that is lower than the first temperature in these illustrative examples.

As depicted, dilution cooler 410 is a second stage cooler for cooling system 400. Cooling fluids for dilution cooler 410 can be circulated though port 412, port 414, and lines 415.

As depicted, payload 416 is thermally connected to dilution cooler 410. In one illustrative example, payload 416 is a quantum computing circuit. In other illustrative examples, payload 416 can include other devices in addition to or in place of a quantum computing circuit. For example, payload 416 can also comprise a at least one of a superconducting circuit, a material and a sensor system, a superconducting material, and infrared imaging system, or some other type of device in addition to or in place of a quantum computing circuit.

In this illustrative example, radiation shields are also present within the interior of payload enclosure 406. These radiation shields operate to reduce or prevent conduction of heat or thermal energy. As depicted, first radiation shield 418 and second radiation shield 420 are present. Second radiation shield 420 is located inside of first radiation shield 418. As depicted, dilution cooler 410 and payload 416 are located within second radiation shield 420. In illustrative example, payload enclosure 406 can also include radiation shielding in some implementations.

In this illustrative example, payload enclosure 406 also has port 444. This port can be used to draw a vacuum within the interior of payload enclosure 406. Alternatively, port 444 can also be used to introduce a gas into the interior of payload enclosure 406.

In this illustrative example, payload 416 can be introduced and removed from payload enclosure 406 through loading chamber 422. As depicted, payload 416 can be moved through loading chamber 422 and payload enclosure 406 using transfer arm 424.

In this illustrative example, loading chamber 422 has gate valve 426 and port 428. Gate valve 426 controllers an aperture that can be opened and closed to separate first section 430 of loading chamber 422 and second section 431 of loading chamber 422 from each other. Second section 431 is in communication with payload enclosure 406. As depicted, gate valve 426 is not directly connected to payload enclosure 406.

Although gate valves are illustrated here, other types of valves with apertures that can be opened and closed can also be used. For example, ball valve with an aperture that can be opened and closed that allow for entry a payload or control circuit can be used in addition to or in place of the gate valve.

In this illustrative example, first radiation shield 418 can totally enclose second radiation shield 420. With this type of configuration, these radiation shields can include shutters or apertures that can be opened and closed to allow for payload 416 to be moved by transfer arm 424 into first radiation shield 440 and subsequent into second radiation shield 442.

In this illustrative example, these radiation shields can reduce radiation from reaching payload 416 within payload enclosure 406. As result, the effects of radiation on sensitive payload, such as quantum computing circuits can be reduced. These radiation shields also provide thermal protection for components such as a control circuit in housing 438 and payload 416. In other words, these radiation shields can provide radiation shielding and thermal insulation.

In one illustrative example, a vacuum or gas may be present within payload enclosure 406. During operation, payload 416 can be introduced into first section 430 of loading chamber 422 using transfer arm 424 while gate valve 426 is closed. Port 428 in first section 430 of loading chamber 422 can be used to draw vacuum or introduce a fluid similar to that in payload enclosure 406.

As a result, loading chamber 422 can be used to set various parameters such as temperature, pressure or vacuum, to desired values before moving payload 416 into payload enclosure 406 from first section 430 of loading chamber 422 or out of payload enclosure 406 into first section 430 of loading chamber 422. These types of adjustments can reduce the time needed to change payloads in payload enclosure 406.

In another illustrative example, payload 416 can be cooled in first section 430 using a fluid prior to be introduced into payload enclosure 406. After the temperature of payload 416 has been reduced, the fluid can be removed, and a vacuum drawn prior to opening gate valve 426 moving payload 416 though second section 431 into payload enclosure 406. As a result, the temperature differential between payload 416 and the temperature in payload enclosure 406 can be reduced. A similar process can be performed by moving payload 416 into first section 430 and allowing payload 416 can increase in temperature while maintaining the lower temperature in payload enclosure 406.

As a result, additional time for at least one of creating a vacuum, warming payload 416, cooling payload 416, and maintain a desired temperature in payload enclosure 406 can be performed without needing to change the environment within payload enclosure 406.

As depicted, control refrigeration unit 404 includes control enclosure 432. As depicted, a set of pulse tube coolers is connected to control enclosure 432. Pulse tube cooler 434 and pulse tube cooler 436 can be seen in this side view of cooling system 400. As depicted, pulse tube cooler 434 and pulse tube cooler 436 extend into the interior of control enclosure 432. Pulse tube cooler 434 and pulse tube cooler 436 are an example of an implementation for coolers 302 in FIG. 3.

As depicted, housing 438 is located within the interior of control enclosure 432. Housing 438 contains control short-circuits (not shown). Housing 438 can be comprised of material that is thermally conductive to enable cooling of a control circuit within housing 438. In this illustrative example, the pulse tube coolers can operate to cool the control circuits within housing 438 to a desired operating temperature for the control circuits.

As depicted, first radiation shield 440 and second radiation shield 442 are present within the interior of control enclosure 432. Second radiation shield 442 is located within first radiation shield 440. In this illustrative example, housing 438 is located within second radiation shield 442.

In this illustrative example, control enclosure 432 has port 446. Port 446 can be used to draw a vacuum within the interior of control enclosure 432 or to introduce a fluid, such as a gas, into the interior of control enclosure 432.

In this illustrative example, housing 438 with control circuits can be introduced and removed from control enclosure 432 using loading chamber 448. As depicted, loading chamber 448 has first section 450 and second section 452. These two sections are separated by gate valve 454. Gate valve 454 has an aperture that can be opened and closed.

Transfer arm 456 can be used to move housing 438 into and out of control enclosure 432 through loading chamber 448. For example, housing 438 can be moved from loading chamber 448 through the aperture in gate valve 454 into control enclosure 432 using transfer arm 456. Additionally, port 458 can be used to draw vacuum or introduce a fluid into first section.

In one illustrative example, first radiation shield 440 can totally enclose second radiation shield 442. With this type of configuration, these radiation shields can include shutters for apertures that can be opened and closed to allow for housing 438 to be moved by transfer arm 456 into first radiation shield 440 and subsequently into second radiation shield 442.

If a vacuum is present in control enclosure 432, a vacuum can be drawn with housing 438 in first section 450 loading chamber 448 prior to opening aperture in gate valve 454 to move housing 438 into control enclosure 432. In this manner, a vacuum does not have to be drawn for all of control enclosure 432. This feature can reduce the amount of time needed to introduce or remove housing 438 from control enclosure 432.

A similar process can be to cool housing 438 with a fluid prior to introducing housing 438 into control enclosure 432. Also, housing 438 can be moved into first section 450 with the aperture in gate valve 454 being closed and the temperature of housing 438 can be increased at a desired rate in first section 450 without needing to increase the temperature in control enclosure 432.

The closed aperture in gate valve 454 reduces the increase in temperature that can occur within control enclosure 432. In other words, the set of coolers can continue to cool control enclosure 432 while the control circuit is increasing temperature in first section 450 while the aperture in gate valve 454 is closed. As a result, the control circuit does not need to be warmed to a desired temperature for removal within control enclosure 432.

As a result, loading chamber 448 can be used to set various parameters such as temperature, pressure or vacuum, to desired levels before moving housing 438 into control enclosure 432 from first section 450 of loading chamber 448 or out of control enclosure 432 into first section 450 of loading chamber 448. These types of adjustments can reduce the time needed to change control circuits in payload enclosure 406.

Further, the use of payload refrigeration unit 402 and control refrigeration unit 404 can reduce the amount of power needed to cool payload 416. For example, when payload 416 in payload refrigeration unit 402 is cooled to lower temperature than the control circuits in housing 438 in control refrigeration unit 404, less power can be used to provide cooling needed in payload refrigeration unit 402 when the control circuits in housing 438 in control refrigeration unit 404 are cooled independently of payload 416. Further, this enables cooling payload 416 to desired temperatures that are currently not always possible when control circuits are located in the same refrigeration unit as a payload. In other words, dilution cooler 410 can operate more efficiently to maintain the desired temperature for payload 416 when control circuits are not located in payload refrigeration unit 402, but in control refrigeration unit 404.

Figure 5:
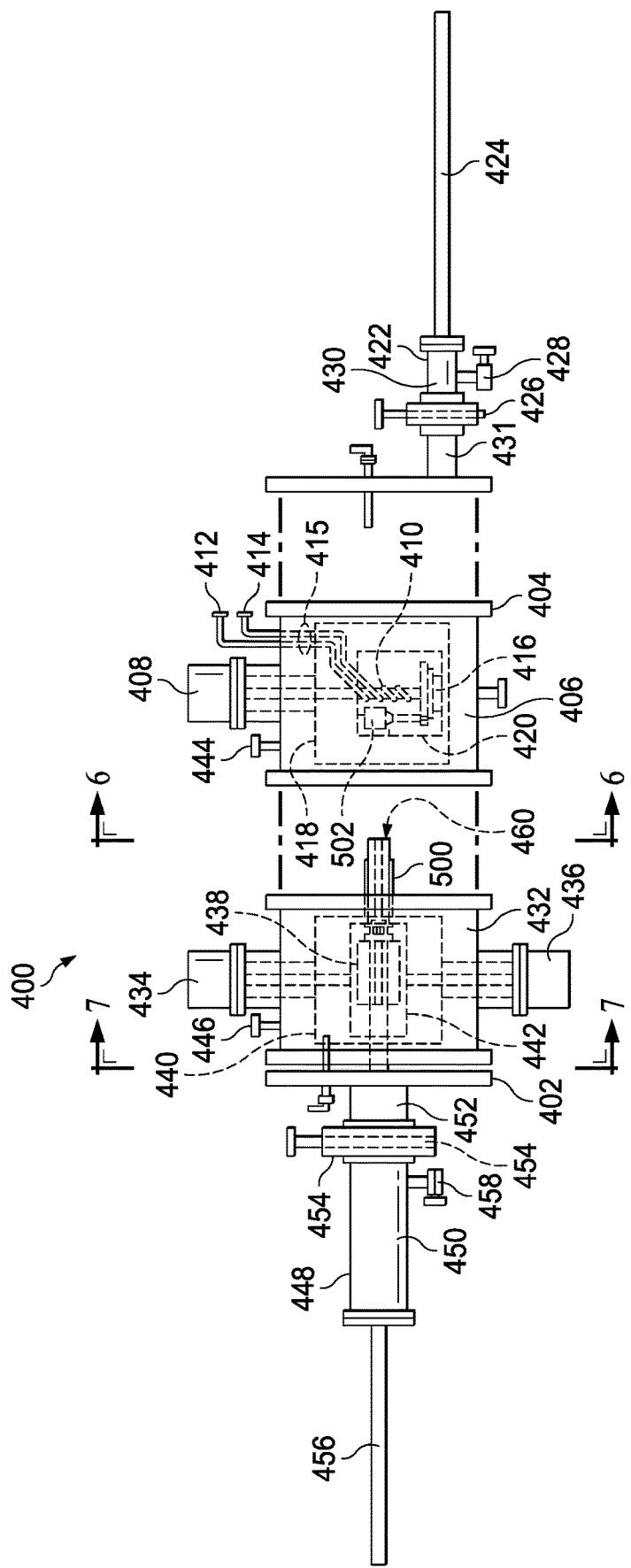
FIG. 5 is an illustration of schematic diagram of an exploded side view of a cooling system in accordance with an illustrative embodiment.

Turning next to FIG. 5, an illustration of schematic diagram of an exploded side view of a cooling system is depicted in accordance with an illustrative embodiment. In this exploded view, electronic interface 460 is depicted as having control circuit connector 500 and payload circuit connector 502. In this illustrative example, control circuit connector 500 can be connected to control enclosure 432 and payload circuit connector 502 can be connected to payload enclosure 406. Control circuit connector 500 can extend from control enclosure 432 into payload enclosure 406.

These two connectors can be disconnected from each other to enable changing out at least one of payload refrigeration unit 402 or control refrigeration unit 404 with another refrigeration unit. For example, control refrigeration unit 404 can be disconnected from payload refrigeration unit 402. Another payload refrigeration unit can be connected to control refrigeration unit 404. As part of this connection, a different payload circuit connector can be connected to control circuit connector 500 when connecting the new payload refrigeration unit to the control refrigeration unit 404.

Figure 6:
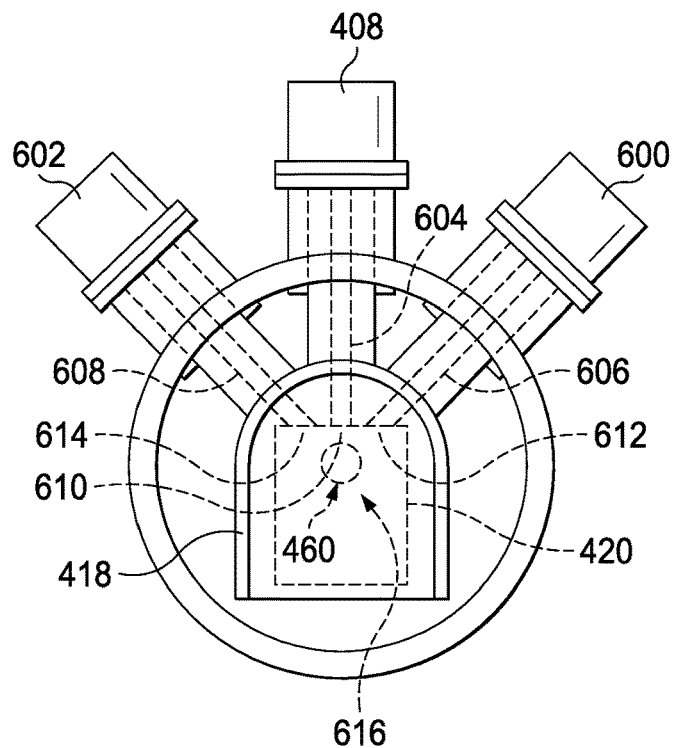
FIG. 6 is an illustration of a schematic diagram of an end view of a payload refrigeration unit in a cooling system in accordance with an illustrative embodiment.

With reference to FIG. 6, an illustration of a schematic diagram of an end view of a payload refrigeration unit in a cooling system is depicted in accordance with an illustrative embodiment. As depicted in this figure, payload refrigeration unit 402 is seen from an end view of cooling system 400 in the direction of lines 6-6 in FIG. 5.

In this end view of payload refrigeration unit 402, pulse tube cooler 600 and pulse tube cooler 602 can also be seen in addition to pulse tube cooler 408 as shown in FIG. 4 and FIG. 5. In this figure and in other some figures, components are present but omitted from the view to avoid obscuring features and components described for the illustrative example.

For example, pulse tube cooler 600 is not illustrated in FIG. 4 and FIG. 5. This component is omitted to avoid obscuring the depiction of pulse tube cooler 408 and thermal connection of pulse tube cooler 408 to first radiation shield 418 and second radiation shield 420. Thus, illustration of pulse tube cooler 600 was also omitted to avoid obscuring the illustration of dilution cooler 410.

As depicted, outer section 604 in pulse tube cooler 408, outer section 606 in pulse tube cooler 600, an outer section 608 in pulse tube cooler 602 are in contact with first radiation shield 418 in payload enclosure 406 in payload refrigeration unit 402. This contact is a thermal contact in these upper sections of these pulse tube coolers and can also be referred to as a thermal connection.

Also depicted are inner section 610 for pulse tube cooler 408, inner section 612 for pulse tube cooler 600, and inner section 614 for pulse tube cooler 602. These inner sections are in thermal contact with second radiation shield 420.

In this illustrative example, the outer sections of the pulse tube coolers can operate to cool first radiation shield 418 to 40 K. The inner sections of the pulse tube coolers can operate to cool second radiation shield 420 to 2 K. The dilution cooler (not shown) located within second radiation shield 420 can cool the payload to 2 mK in this illustrative example. With the pulse tube coolers providing cooling to 40 k and 2 K, the dilution cooler can cool payload to 2 mK more easily.

Also seen in this view is opening 616 in second radiation shield 420. A portion of electronic interface 460 is located and can be connected to other portions of electronic interface 460 through opening 616.

Figure 7:
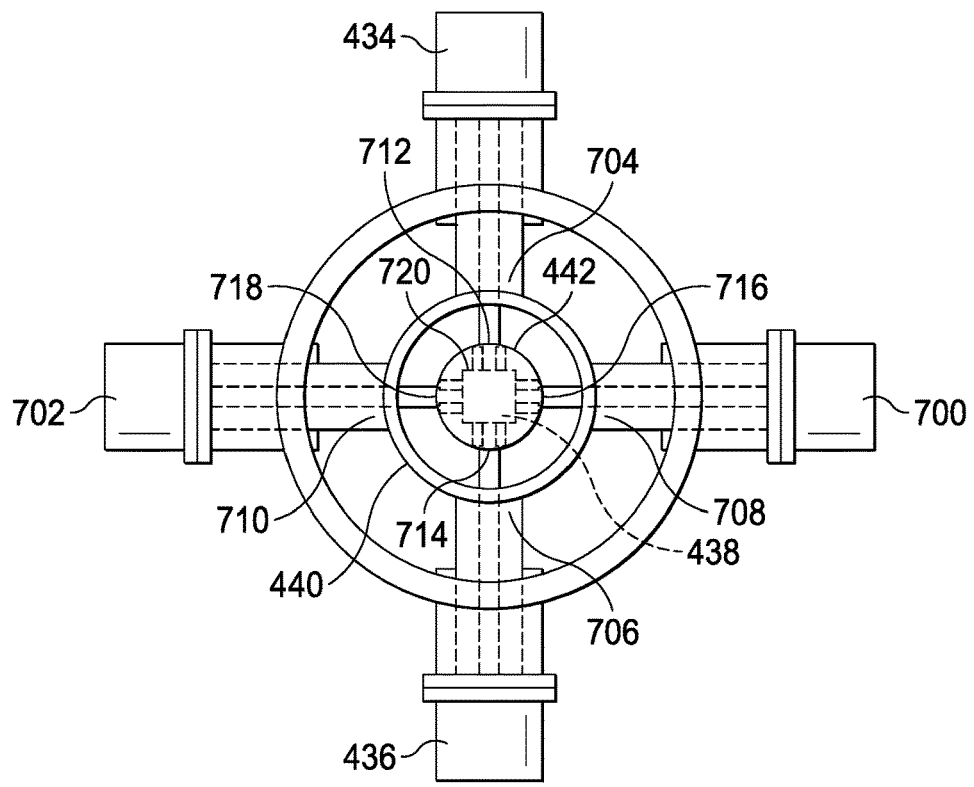
FIG. 7 is an illustration of a schematic diagram and an end view of a control refrigeration unit in a cooling system in accordance with an illustrative embodiment.

With reference to FIG. 7, an illustration of a schematic diagram of an end view of a control refrigeration unit in a cooling system is depicted in accordance with an illustrative embodiment. As depicted in this figure, control refrigeration unit 404 is seen from an end view of cooling system 400 in the direction of lines 7-7 in FIG. 5.

In this end view of payload refrigeration unit 402, pulse tube cooler 700 and pulse tube cooler 702 can also be seen in addition to pulse tube cooler 434 and pulse tube cooler 436.

In this figure, pulse tube cooler 702 is not seen in FIG. 4 and FIG. 5 to avoid obscuring the illustration of components such as first radiation shield 440, second radiation shield 442, housing 438, an electronic interface 460 located within control enclosure 432.

As depicted, outer section 704 in pulse tube cooler 434, outer section 706 in pulse tube cooler 436, outer section 708 in pulse tube cooler 700, and outer section 710 in pulse tube cooler 702 are in contact with first radiation shield 440 in control enclosure 432 in control refrigeration unit 404. This contact is a thermal contact in these upper sections of these pulse tube coolers. This thermal contact can also be referred to as a thermal connection.

This figure also depicts inner section 712 for pulse tube cooler 434, inner section 714 for pulse tube cooler 436, inner section 716 for pulse tube cooler 700, and inner section 718 for pulse tube cooler 702. These inner sections are in thermal contact with second radiation shield 420.

In this illustrative example, the outer sections of the pulse tube coolers can operate to cool first radiation shield 440 to 40 K. The inner sections of the pulse tube coolers can operate to cool second radiation shield 442 to 2 K. In this illustrative example, the control circuits can operate at a temperature of 2 k or greater depending on the particular implementation.

Also depicted in this view is receptacle 720 in which housing 438 with control circuits is located. Receptacle 720 has dimensions that are selected to receive housing 438.

Figure 8:
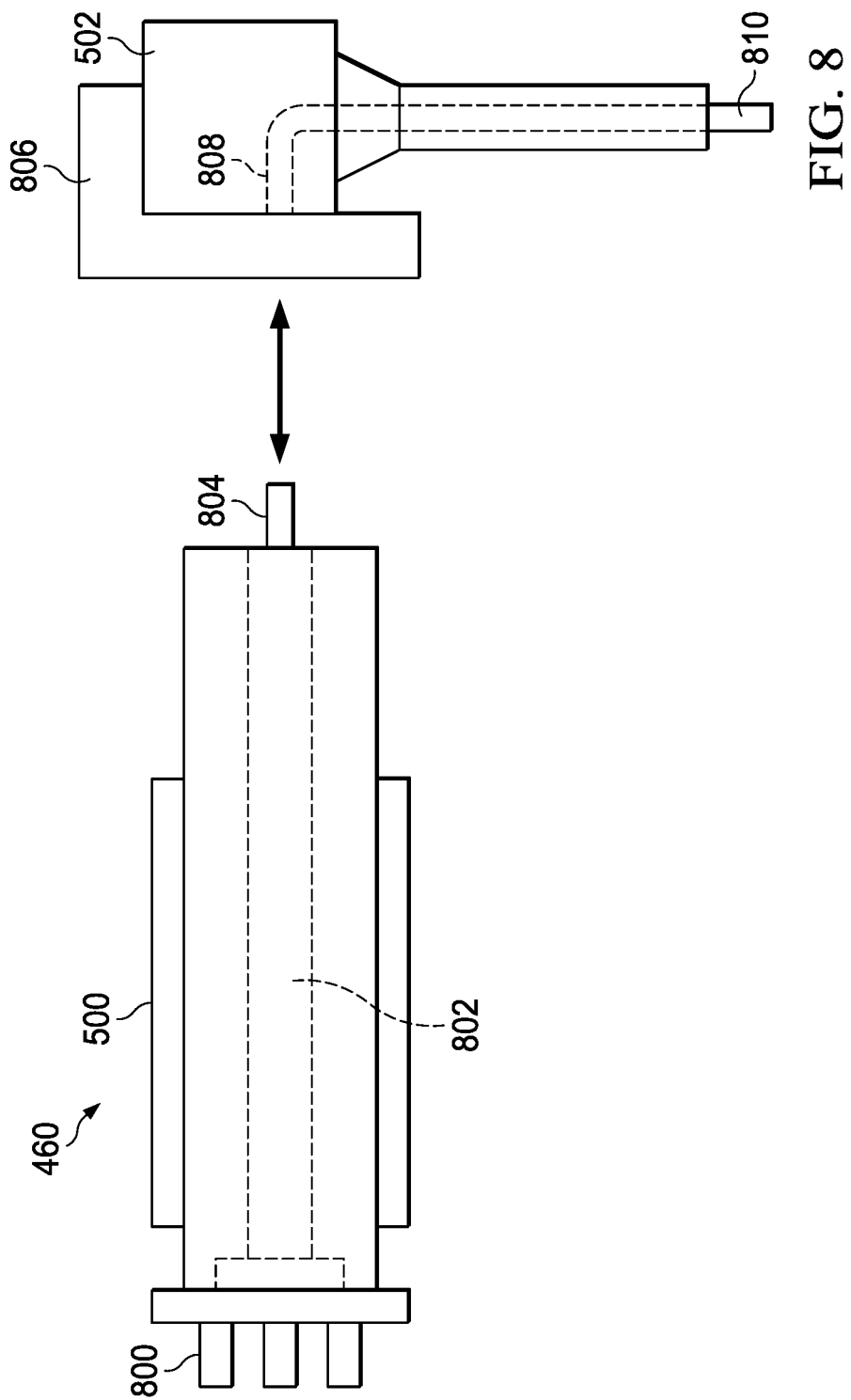
FIG. 8 is an illustration of a schematic diagram of an electronic interface in accordance with an illustrative embodiment.

With reference next to FIG. 8, an illustration of a schematic diagram of an electronic interface is depicted in accordance with an illustrative embodiment. An enlarged view of electronic interface 460 in FIG. 4 and FIG. 5 is depicted. As depicted, electronic interface 460 can be comprised of conductive materials for the ticket type of signal used. For example, electronic interface 460 can include at least one of a metal, a metal alloy, gold, copper, carbon-based fiber, a superconducting material, niobium-titanium, Yttrium barium copper oxide, or other materials that can conduct electrical signals in electronic interface 460.

In this illustrative example, electronic interface 460 has an electrical signal path that comprises a number of different components. As depicted, this electrical signal path comprises housing connector 800, wiring 802, pin connector 804, pin receiver 806, wire 808, and pin connector 810. In the illustrative example, these components can be implemented using superconducting materials. The use of superconducting materials or other materials with low thermal conductivity can reduce thermal loads. In illustrative example, low thermal conductivity can be metals or other materials having a thermal conductivity below 10 W/m·K. One example of a material can be Niobium.

Housing connector 800 in control circuit connector 500 can be connected to housing 438 containing control circuits. Pin connector 804 in control circuit connector 500 can be connected to pin receiver 806 in payload circuit connector 502. As depicted, pin connector 810 in payload circuit connector 502 can be connected to payload 416.

In this manner, a signal path for electrical signals can be established between a control circuit in housing 438 and payload 416. With this connection, communications of information encoded in signals can be facilitated between the control circuit in housing 438 and payload 416. This information can be, for example, commands and data.

Pin connector 804 in control circuit connector 500 can be inserted into pin receiver 806 in payload circuit connector 502 to provide a signal connection such that signals can be transmitted between the control circuit in housing 438 and payload 416.

This illustration of electronic interface 460 presented as an example of one implementation for signal interface 112 in FIG. 1. This illustration is not to limit the manner in which other illustrative examples can be appointed. For example, signal interface 112 can be implemented as an optical interface rather than an electronic interface or combination thereof.

Figure 9:
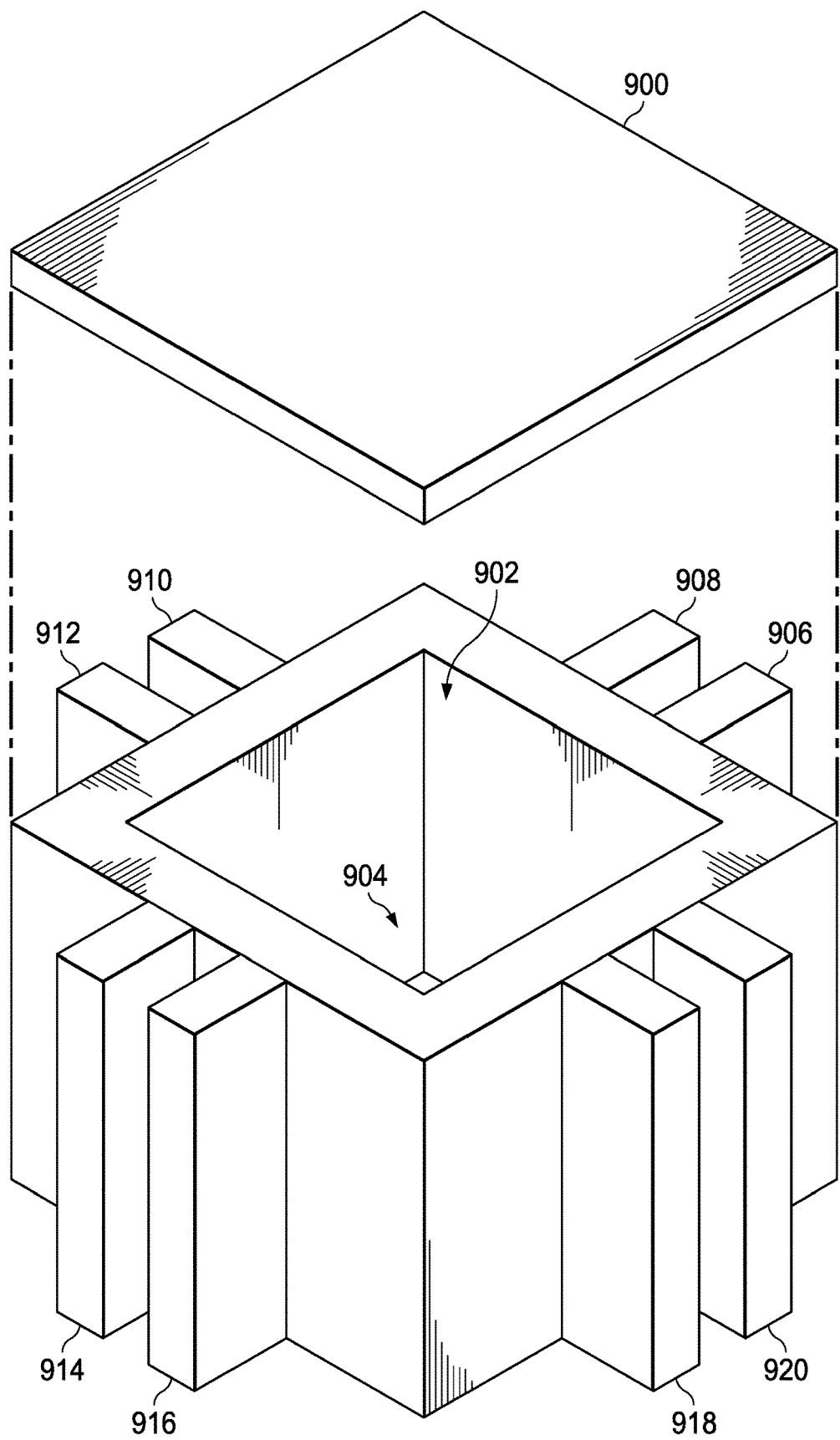
FIG. 9 is an illustration of a schematic diagram of a perspective view of housing in accordance with an illustrative embodiment.

Turning to FIG. 9, an illustration of a schematic diagram of a perspective view of housing is depicted in accordance with an illustrative embodiment. In this perspective view of housing 438 in FIG. 7, cover 900 can be removed to show interior 904 in which a control circuit can be located.

In this illustrative example, housing 438 can be sealed to be air-tight when cover 900 in secured to opening 902. A vacuum can be present within interior 904 when housing 438 is sealed. In another example, a gas can be present within interior when housing 438 is sealed.

As depicted, fins, such as fin 906, fin 908, fin 910, fin 912, fin 914, fin 916, fin 918, and fin 920 extend from housing 438. These structures can be used to increase at least one of the speed or amount of cooling of housing 438.

Figure 10:
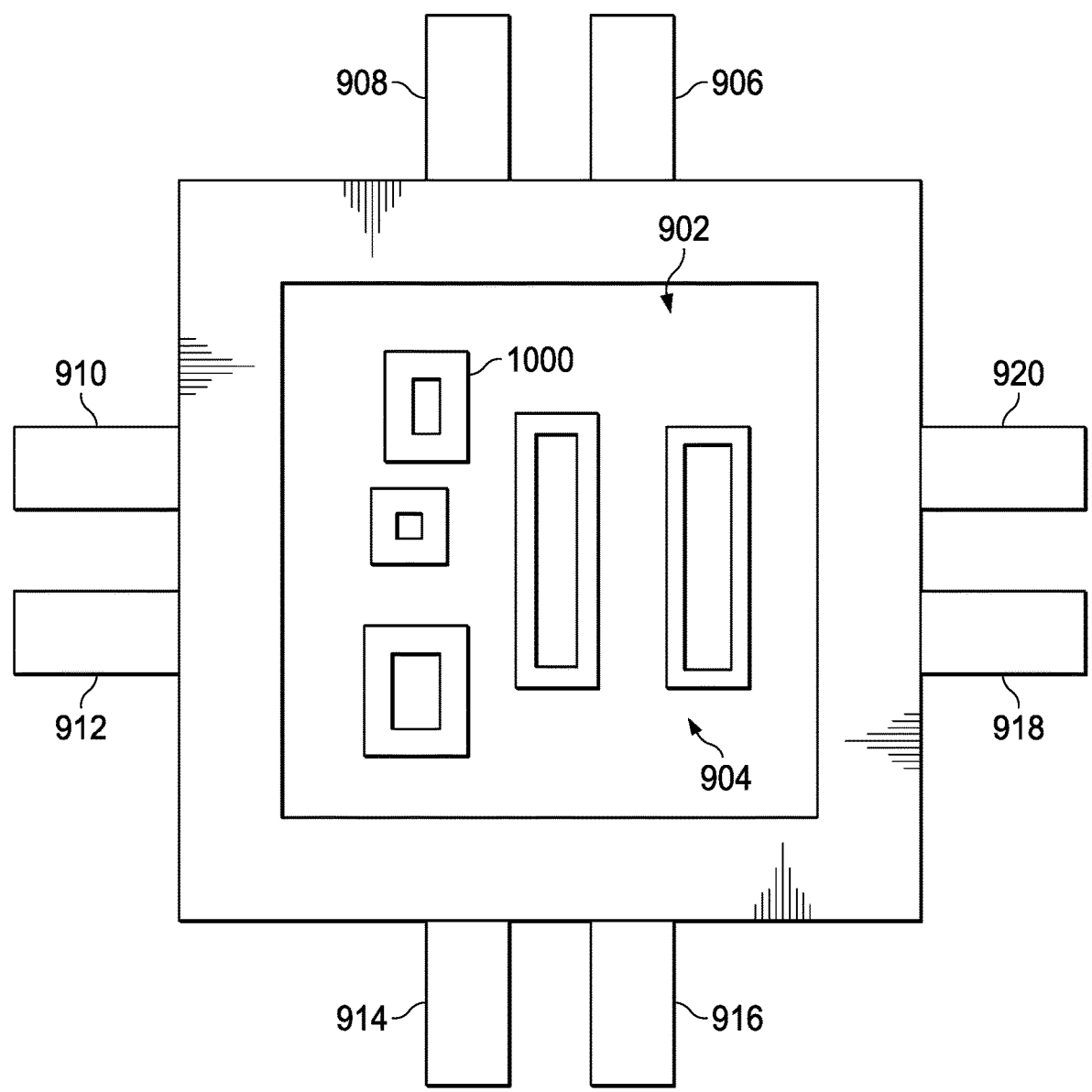
FIG. 10, an illustration of a schematic diagram of a top view of housing in accordance with an illustrative embodiment.

With reference to FIG. 10, an illustration of a schematic diagram of a top view of housing is depicted in accordance with an illustrative embodiment. In this top view of housing 438, control circuit 1000 can be seen within interior 904 thought opening 902 of housing 438. In this illustrative example, control circuit 1000 in housing 438 can generate more heat than payload 416. Control circuit 1000 can also operate at a higher temperature than payload 416.

In this illustrative example, these fins are designed to provide a thermal contact to second radiation shield 442. These fins can increase the thermal conductivity in a manner that facilitated increased cooling of housing 438 and in turn cooling of control circuit 1000 in housing 438.

Figure 11:
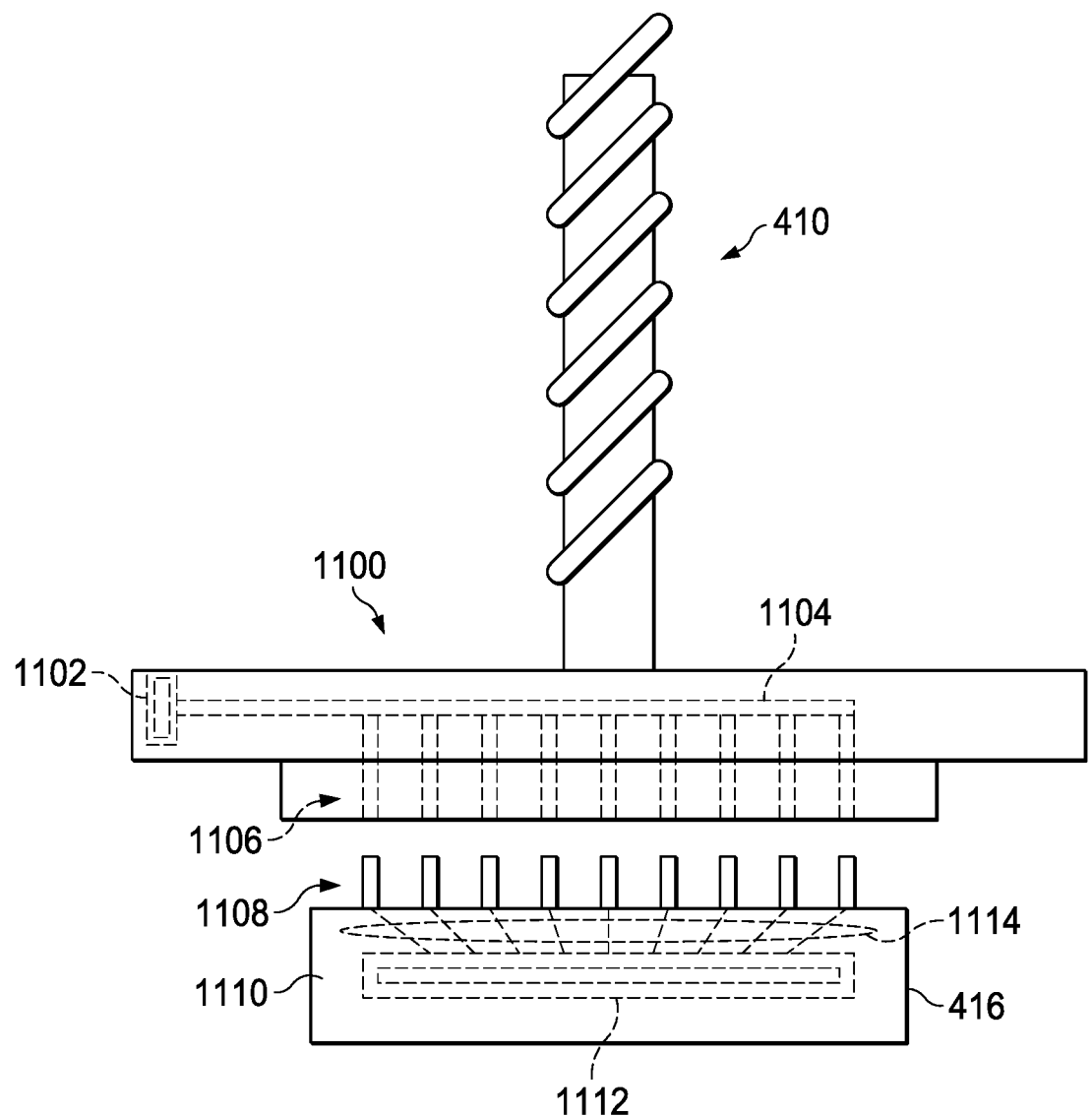
FIG. 11 is an illustration of a schematic diagram of dilution cooler with a connector for a payload in accordance with an illustrative embodiment.

Turning to FIG. 11, an illustration of a schematic diagram of dilution cooler with a connector for a payload is depicted in accordance with an illustrative embodiment. As depicted, a portion of dilution cooler 410 in FIG. 5 is shown in an enlarged exposed view to illustrate connector 1100 for payload 416.

In this illustrative example, connector 1100 comprises a number of different components. As depicted, connector 1100 comprises pin receiver 1102, conductive lines 1104, and pin receivers 1106.

As depicted, pin receiver 1102 has a configuration with dimensions that can receive pin connector 810 in payload circuit connector 502 in FIG. 8. Conductive lines 1104 connect pin receiver 1102 to pin receiver 1106. In this illustrative example, pin receivers 1106 can receive pins 1108 extending from payload 416. When payload 416 is detached to dilution cooler 410.

In this illustrative example, payload 416 can be comprised carrier 1110 holding quantum computing circuit 1112. As depicted, lines 1114 connect quantum computing circuit 1112 to pins 1108 extending from carrier 1110.

The illustration of cooling system 400 in the different components in FIGS. 4-11 are pictorial schematic diagrams intended to illustrate features in the different illustrative examples. These illustrations are not meant to limit the manner in which other illustrative examples can be implemented.

Illustration of housing 438 in FIG. 9 and FIG. 10 is provided as an example an implementation for housing 304 FIG. 3. This illustration is not meant to limit the manner in which other illustrative examples can be present. In another illustrative example, housing 438 may not be sealed. In yet another illustrative example, a different number of fins other than eight fins as depicted in figures may be present. Still in another illustrative example, fins can be omitted from housing 438.

As another example, the illustration of connector 1100 and payload 416 are presented for illustrating one manner in which an illustrative embodiment can be implemented. In other illustrative examples, connector 1100 can be considered part of payload circuit connector 502. In one illustrative example, wire 808 in payload circuit connector 502 can extend and connect to conductive lines 1104 without using pin connector 810 and pin receiver 1102.

In yet another illustrative example, payload 416 can be quantum computing circuit 1112 that has pins or other types of connectors for connection to pin receivers 1106 without carrier 1110. In yet other illustrative examples, other types of components can be present in addition to or in place of quantum computing circuit 1112. For example, quantum computing circuit 1112, a sensor, and a material can comprise components in payload 416. In other words, payload 416 can include more than one circular component.

Figure 12:
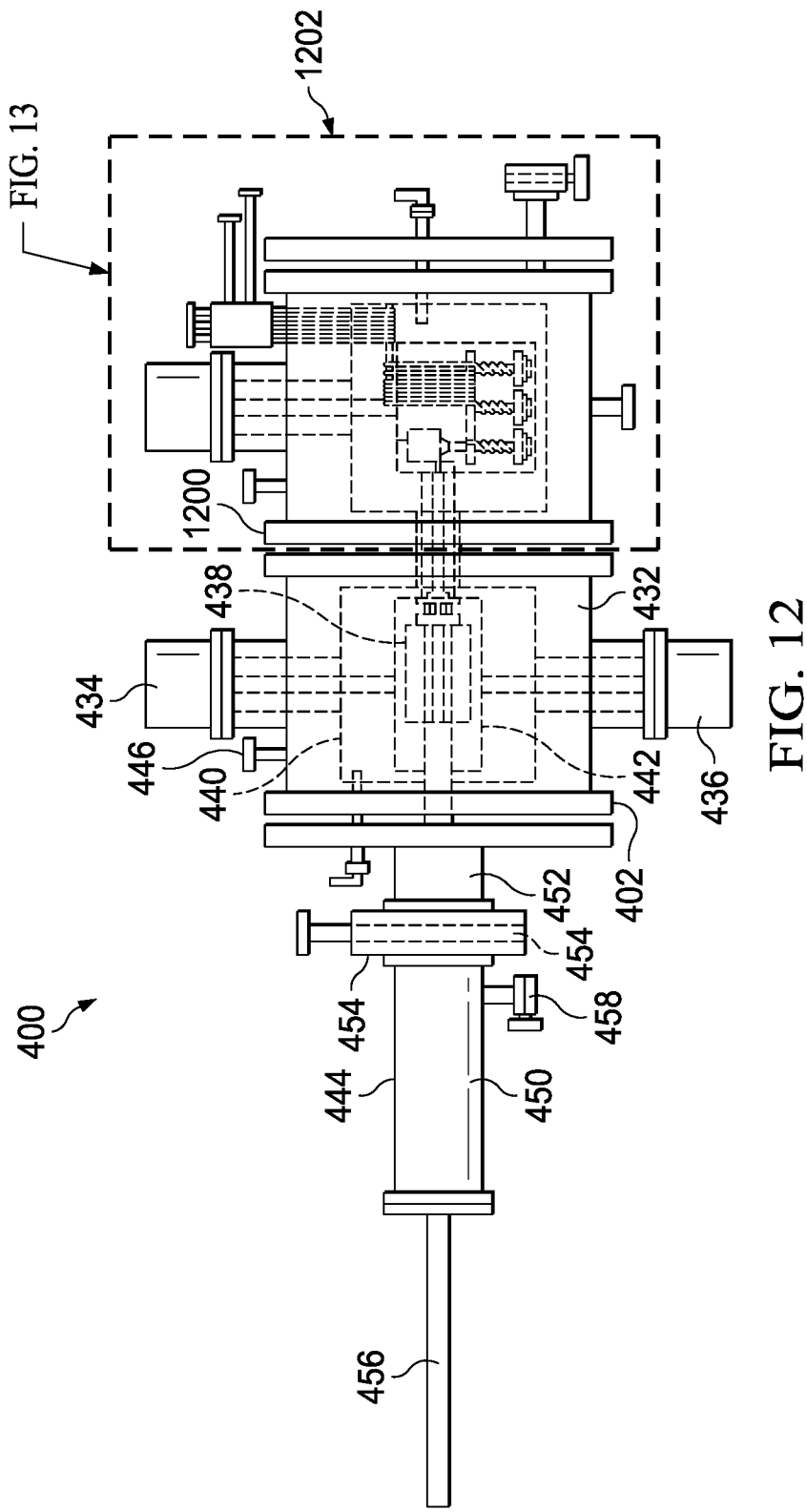
FIG. 12 is an illustration of a schematic diagram of side view of a cooling system configured for multiple payloads is depicted in accordance with an illustrative embodiment.

Turning now to FIG. 12, an illustration of a schematic diagram of side view of a cooling system configured for multiple payloads is depicted in accordance with an illustrative embodiment. In this illustrative example, payload refrigeration unit 1200 in section 1202 replaces payload refrigeration unit 402.

Figure 13:
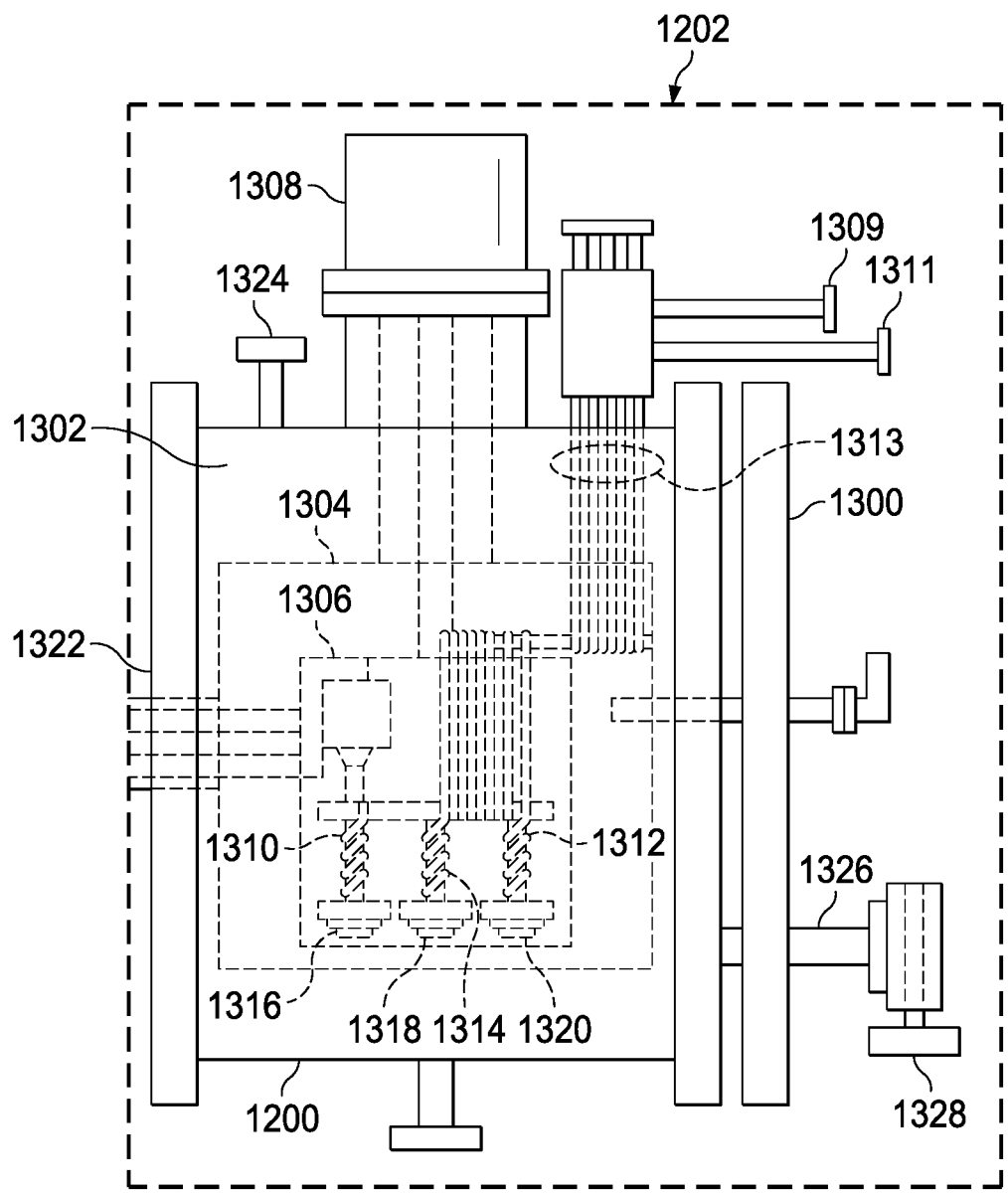
FIG. 13 is an enlarged view of payload the refrigeration unit in FIG. 12 in accordance with an illustrative embodiment.

In FIG. 13, an enlarged view of payload the refrigeration unit in FIG. 12 is depicted in accordance with an illustrative embodiment. In this figure, an enlarged view of payload refrigeration unit 1200 in section 1202 is shown in this illustrative example.

As depicted, payload refrigeration unit 1200 comprises payload enclosure 1302 with first radiation shield 1304 and second radiation shield 1306. In this example, second radiation shield 1306 is located within first radiation shield 1304.

In this illustrative example, cooling is provided by pulse tube cooler 1308. Additional pulse tube coolers are present but not shown to avoid obscuring the illustration of features within payload refrigeration unit 1200 in the illustrative example.

Additionally, cooling can be provided by multiple dilution coolers. In this depicted example, dilution cooler 1310, dilution cooler 1312, and dilution cooler 1314 are present within payload enclosure 1302. As depicted, port 1309, port 1311, and lines 1313 provide at least one of coolant to dilution cooler 1310, dilution cooler 1312, and dilution cooler 1314.

With these multiple dilution coolers, multiple payloads can also be present and operate within payload refrigeration unit 1200. As depicted, payload 1316, payload 1318, and payload 1320 are present. Payload 1316 is thermally connected to dilution cooler 1310; payload 1318 is thermally connected to dilution cooler 1314; and payload 1320 is thermally connected to dilution cooler 1312.

These payloads are also electrically connected to payload circuit connector 1322. Control circuit connector 500 in control refrigeration unit 404 can be connected to payload circuit connector 1300 in payload refrigeration unit 1200 to form the electronic interface for this implementation of cooling system 400. In this manner, the control circuits in control refrigeration unit 404 can communicate with at least one of payload 1316, payload 1318, or payload 1320.

As depicted, port 1324 is present in payload enclosure 1302. Port 1324 can be used to perform operations such as introducing a gas, drawing a vacuum, or some other suitable operation.

Also depicted is section 1326 and gate valve 1328 for loading chamber. The second section in the loading chamber on the other side of gate valve 1328 and a transfer are not shown in this illustration. This loading chamber can be used to introduce or can remove at least one of payload 1316, payload 1318, or payload 1320 from payload enclosure 1302.

Figure 14:
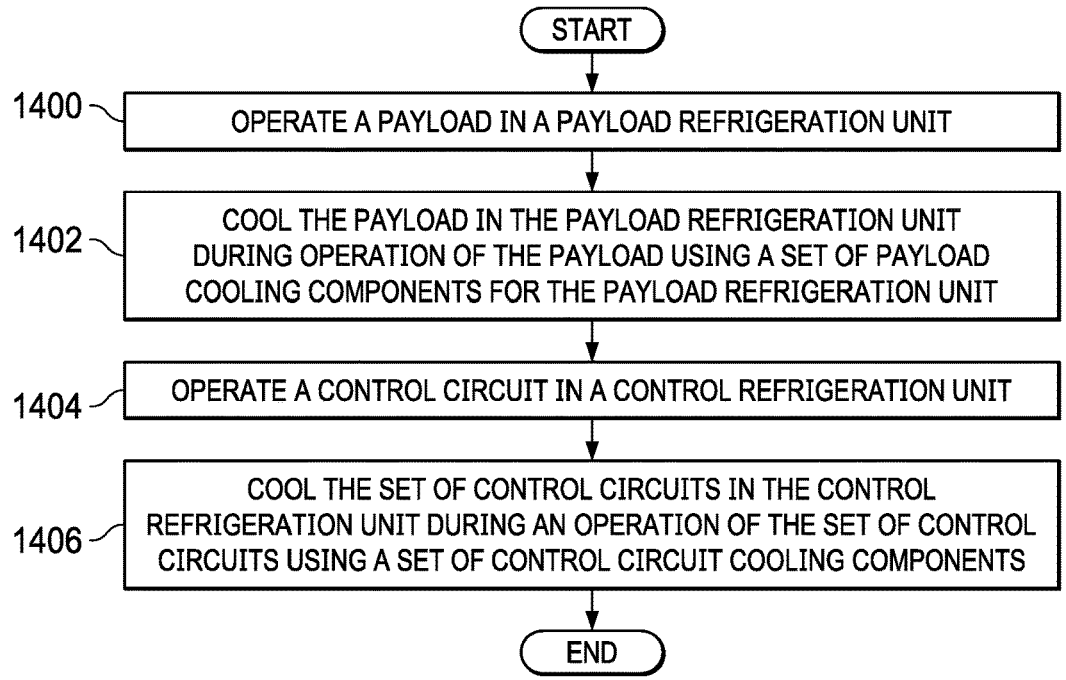
FIG. 14 is an illustration of a flowchart of a process for controlling a cooling environment in accordance with an illustrative embodiment.

The illustration of payload refrigeration unit 1200 for cooling system 400 is provided as an example of some implementations for cooling system 102 in FIG. 1. These illustrations are not meant to limit the manner in which other illustrative examples can be implemented. For example, in another illustrative example, one or more additional payload refrigeration units can be connected to control refrigeration unit 404. In yet another example, one or more control refrigeration units can be connected to payload refrigeration unit 402. As yet another example, other numbers of dilution coolers can be present in payload refrigeration unit Turning next to FIG. 14, an illustration of a flowchart of a process for controlling a cooling environment is depicted in accordance with an illustrative embodiment. The process in FIG. 14 can be implemented in hardware, software, or both. When implemented in software, the process can take the form of program code that is run by one or more processor units located in one or more hardware devices in one or more computer systems. For example, the process can be implemented in cooling system 102 in FIGS. 1-3 and cooling system 400 in FIGS. 4-11.

The process begins by operating a payload in a payload refrigeration unit (operation 1400). The process cools the payload in the payload refrigeration unit during operation of the payload using a set of payload cooling components for the payload refrigeration unit (operation 1402).

The process operates a control circuit in a control refrigeration unit (operation 1404). The process cools the set of control circuits in the control refrigeration unit during an operation of the set of control circuits using a set of control circuit cooling components (operation 1406). The process terminates thereafter.

Figure 15:
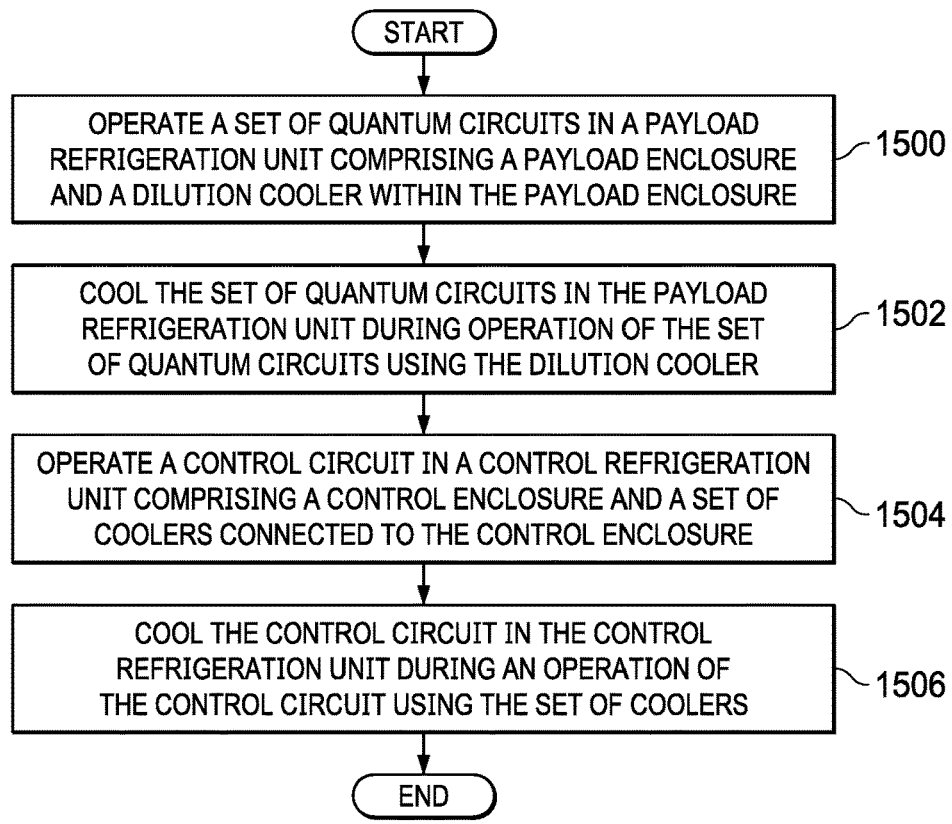
FIG. 15 is an illustration of a flowchart of a process for controlling a quantum circuit environment in accordance with an illustrative embodiment.

Turning to FIG. 15, an illustration of a flowchart of a process for controlling a quantum circuit environment is depicted in accordance with an illustrative embodiment. The process in FIG. 15 can be implemented in hardware, software, or both. When implemented in software, the process can take the form of program code that is run by one of more processor units located in one or more hardware devices in one or more computer systems. For example, the process can be implemented in cooling system 102 in FIGS. 1-3 and cooling system 400 in FIGS. 4-11.

Process begins by operating a set of quantum circuits in a payload refrigeration unit comprising a payload enclosure and a dilution cooler within the payload enclosure (operation 1500). In operation 1500, the set of quantum circuits is thermally connected to the dilution cooler.

The process cools the set of quantum circuits in the payload refrigeration unit during operation of the set of quantum circuits using the dilution cooler (operation 1502). Although operation 1502 describes cooling the set of quantum circuits during operation of the set of quantum circuits, the cooling can also occur during at least one of before or after operation of the set of quantum circuits.

The process operates a control circuit in a control refrigeration unit comprising a control enclosure and a set of coolers connected to the control enclosure (operation 1504). In operation 1504, the set of control circuits is thermally connected to set of coolers within the control enclosure and operates to control the set of quantum circuits. The process cools the control circuit in the control refrigeration unit during an operation of the control circuit using the set of coolers (operation 1506). The process terminates thereafter.

Although the flowcharts show operations in a particular order, this order is for purposes of illustrating operations and is not meant to imply that the depicted order. The different operations in FIG. 15 and in other flowcharts can be performed in parallel at substantially the same time when possible to implement features of the different illustrative examples for cooling system 102 in FIGS. 1-3 and cooling system 400 in FIGS. 4-11.

For example, without limitation, operation 1500 and operation 1504 can be performed in parallel. In other words, these two operations can be performed at substantially the same time but do not have to start and stop at the same time.

Figure 16:
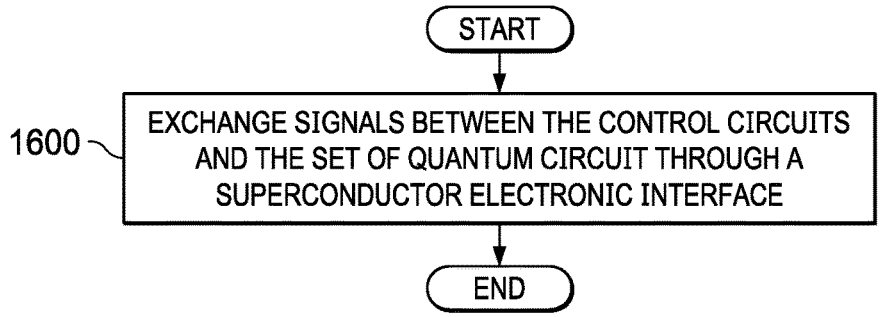
FIG. 16 is an illustration of a flowchart of a process for exchanging signals in a quantum circuit environment in accordance with an illustrative embodiment.

Turning to FIG. 16, an illustration of a flowchart of a process for exchanging signals in a quantum circuit environment is depicted in accordance with an illustrative embodiment. This figure illustrates an example of an additional operation that can be performed in the flowchart in FIG. 15.

The process exchanges signals between the control circuits and the set of quantum circuits through a superconductor electronic interface (operation 1600). The process terminates thereafter.

Figure 17:
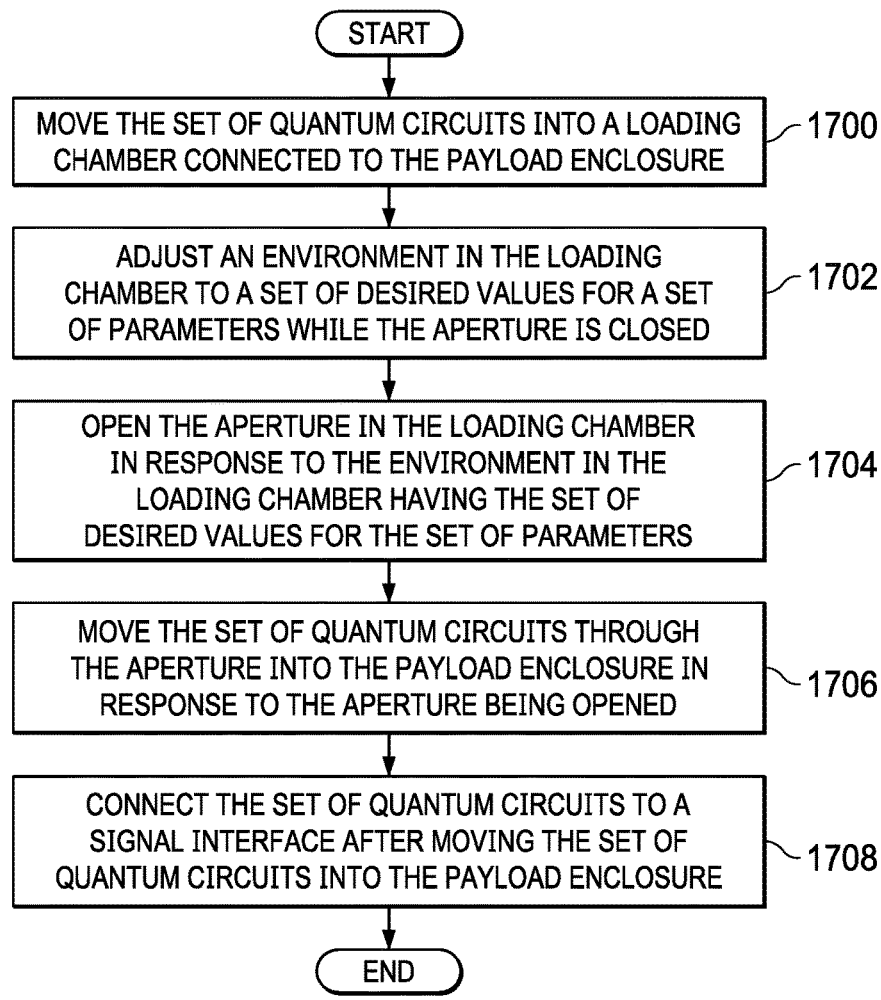
FIG. 17 an illustration of a process for moving quantum circuits into a payload in a quantum circuit environment in accordance with an illustrative embodiment.

Turning to FIG. 17, an illustration of a process for moving quantum circuits into a payload in a quantum circuit environment is depicted in accordance with an illustrative embodiment. This figure illustrates additional operations that can be performed in the flowchart in FIG. 15.

The process begins by moving the set of quantum circuits into a loading chamber connected to the payload enclosure (operation 1700). In operation 1700, the loading chamber has an aperture. In this example, the aperture can be implemented in a device such as a gate value. This aperture can be located anywhere along the length of the loading chamber.

The process adjusts an environment in the loading chamber to a set of desired values for a set of parameters while the aperture is closed (operation 1702). The set of parameters in operation 1702 can be selected from at least one of a temperature, a vacuum level, a pressure, or some others selected parameter. The set of desired values can be a value for a parameter for which value to be matched or within a tolerance or range to the value of for the parameter in the payload enclosure.

The process opens the aperture in the loading chamber in response to the environment in the loading chamber having the set of desired values for the set of parameters (operation 1704). In this illustrative example, the aperture can be an aperture in a gate valve that can be opened and closed.

The process moves the set of quantum circuits through the aperture into the payload enclosure in response to the aperture being opened (operation 1706). The process connects the set of quantum circuits to a signal interface after moving the set of quantum circuits into the payload enclosure (operation 1708). The process terminates thereafter.

In operation 1708, the connection may be made between the set of quantum circuits and a signal interface through a connector. The connector can be, for example, a pin connector system in which the connection can be made by moving the set of quantum circuits into the appropriate location within the quantum circuit refrigeration unit.

Figure 18:
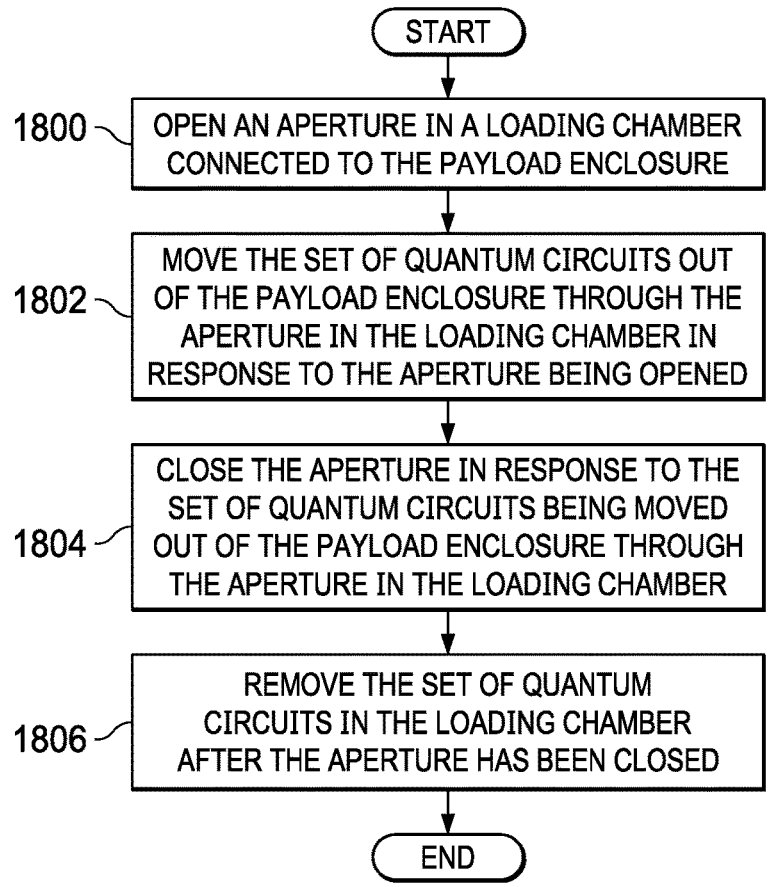
FIG. 18 is an illustration of a process for moving control a payload out of a payload enclosure in a quantum circuit environment in accordance with an illustrative embodiment.

With reference to FIG. 18, an illustration of a process for moving control a payload out of a payload enclosure in a quantum circuit environment is depicted in accordance with an illustrative embodiment. This figure illustrates additional operations that can be performed in the flowchart in FIG. 15.

The process begins by opening an aperture in a loading chamber connected to the payload enclosure (operation 1800). The process moves the set of quantum circuits out of the payload enclosure through the aperture in the loading chamber in response to the aperture being opened (operation 1802). In this illustrative example, moving the set of quantum circuits through the aperture enables closing aperture to separate the set of quantum circuits from the environment in the payload enclosure.

The process closes the aperture in response to the set of quantum circuits being moved out of the payload enclosure through the aperture in the loading chamber (operation 1804). Process removes the set of quantum circuits in the loading chamber after the aperture has been closed (operation 1806). The process terminates thereafter.

Figure 19:
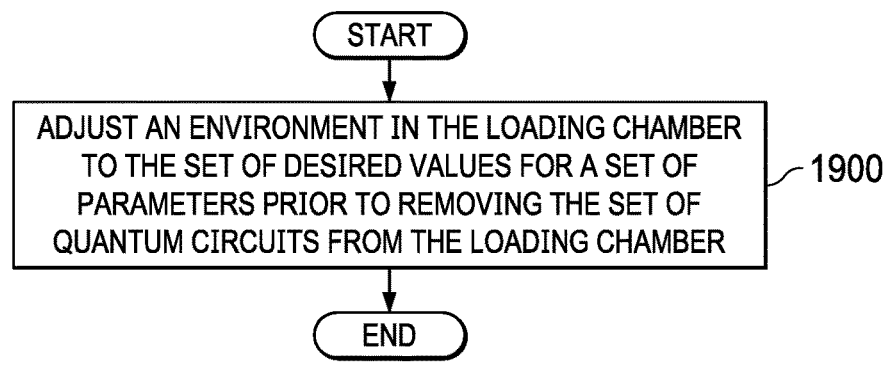
FIG. 19 is an illustration of a process for moving a set of quantum circuits out of a payload enclosure in a quantum circuit environment in accordance with an illustrative embodiment.

Tuning now to FIG. 19, an illustration of a process for moving a set of quantum circuits out of a payload enclosure in a quantum circuit environment is depicted in accordance with an illustrative embodiment. This figure illustrates an additional operation that can be performed in the flowchart in FIG. 18.

The process adjusts an environment in the loading chamber to a set of desired values for a set of parameters prior to removing the set of quantum circuits from the loading chamber (operation 1900). The process terminates thereafter.

Figure 20:
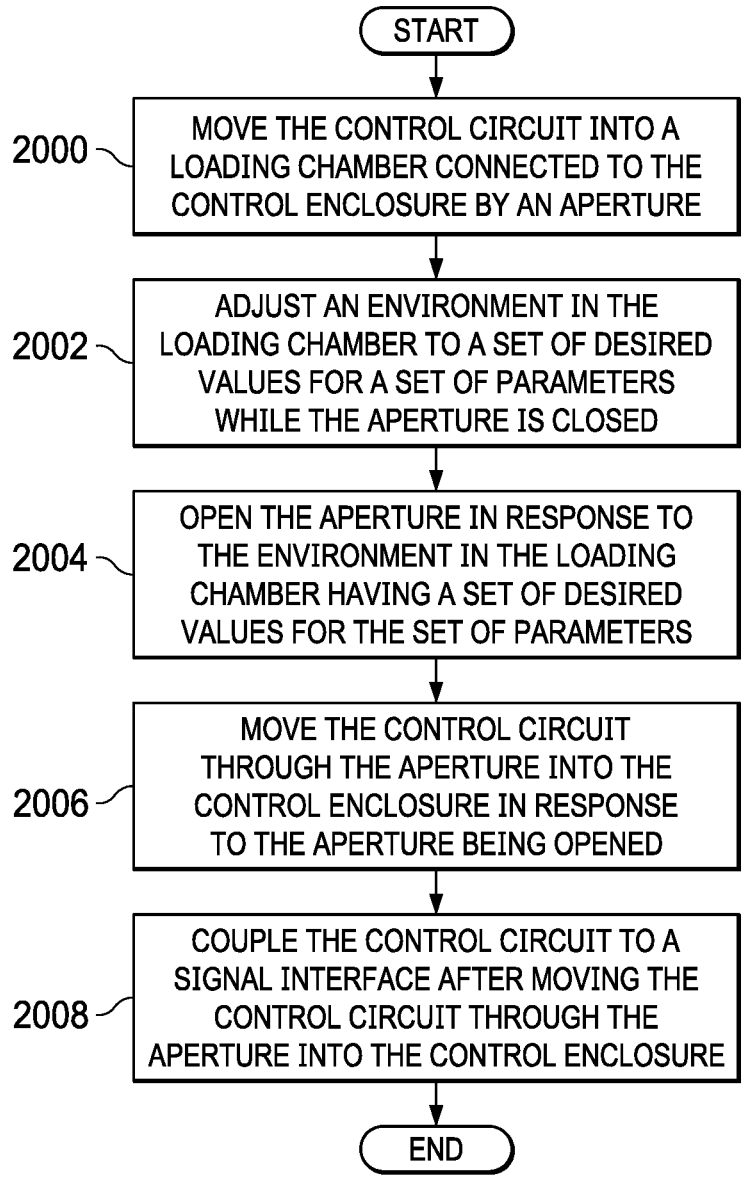
FIG. 20 is an illustration of a process for moving a control circuit into a control enclosure in a quantum circuit environment in accordance with an illustrative embodiment.

With reference now to FIG. 20, an illustration of a process for moving a control circuit into a control enclosure in a quantum circuit environment is depicted in accordance with an illustrative embodiment. This figure illustrates additional operations that can be performed in the flowchart in FIG. 15.

The process begins by moving the control circuit into a loading chamber connected to the control enclosure by an aperture (operation 2000). The process adjusts an environment in the loading chamber to a set of desired values for a set of parameters while the aperture is closed (operation 2002). In operation 2002, the set of parameters can be at least one of a temperature, a vacuum, pressure, or some other selected parameter.

The process opens the aperture in response to the environment in the loading chamber having a set of desire values for the set of parameters (operation 2004). The process moves the control circuit through the aperture into the control enclosure in response to the aperture being opened (operation 2006).

The process couples the control circuit to a signal interface after moving the control circuit through the aperture into the control enclosure (operation 2008). The process terminates thereafter.

Figure 21:
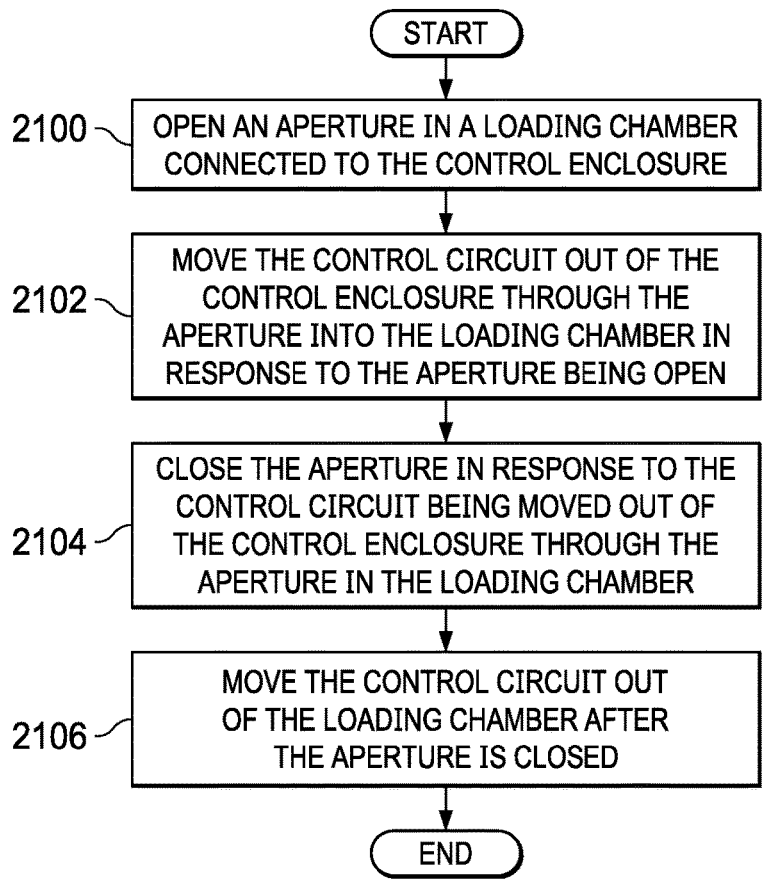
FIG. 21 is an illustration of a process for moving a control circuit out of a control enclosure in a quantum circuit environment in accordance with an illustrative embodiment.

With reference now to FIG. 21, an illustration of a process for moving a control circuit out of a control enclosure in a quantum circuit environment is depicted in accordance with an illustrative embodiment. This figure illustrates additional operations that can be performed in the flowchart in FIG. 15.

The process opens an aperture in a loading chamber connected to the control enclosure (operation 2100). The process moves the control circuit out of the control enclosure through the aperture into the loading chamber in response to the aperture being open (operation 2102).

The process closes the aperture in response to the control circuit being moved out of the control enclosure through the aperture in the loading chamber (operation 2104). The process moves the control circuit out of the loading chamber after the aperture is closed (operation 2106). process terminates thereafter.

Figure 22:
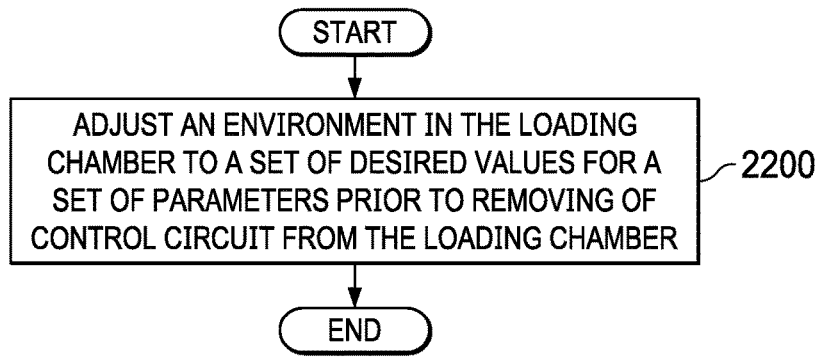
FIG. 22 is an illustration of a process for moving a set of control circuits out of a payload enclosure in a quantum circuit environment in accordance with an illustrative embodiment.

Tuning now to FIG. 22, an illustration of a process for moving a set of control circuits out of a payload enclosure in a quantum circuit environment is depicted in accordance with an illustrative embodiment. This figure illustrates an additional operation that can be performed in the flowchart in FIG. 21.

The process adjusts an environment in the loading chamber to a set of desired values for a set of parameters prior to removing the control circuit from the loading chamber (operation 2200). The process terminates thereafter.

The flowcharts and block diagrams in the different depicted embodiments illustrate the architecture, functionality, and operation of some possible implementations of apparatuses and methods in an illustrative embodiment. In this regard, each block in the flowcharts or block diagrams can represent at least one of a module, a segment, a function, or a portion of an operation or step. For example, one or more of the blocks can be implemented as program code, hardware, or a combination of the program code and hardware. When implemented in hardware, the hardware can, for example, take the form of integrated circuits that are manufactured or configured to perform one or more operations in the flowcharts or block diagrams. When implemented as a combination of program code and hardware, the implementation may take the form of firmware. Each block in the flowcharts or the block diagrams can be implemented using special purpose hardware systems that perform the different operations or combinations of special purpose hardware and program code run by the special purpose hardware.

In some alternative implementations of an illustrative embodiment, the function or functions noted in the blocks may occur out of the order noted in the figures. For example, in some cases, two blocks shown in succession may be performed substantially concurrently, or the blocks may sometimes be performed in the reverse order, depending upon the functionality involved. Also, other blocks may be added in addition to the illustrated blocks in a flowchart or block diagram.

For example, operation 1502 in FIG. 15 is an optional step that can be omitted in some illustrative examples. As another example, operation 2002 in FIG. 20 is also an optional step optional and can be omitted in some illustrative examples.

Some features of the illustrative examples are described in the following clauses. These clauses are examples of features not intended to limit other illustrative examples.

Clause 1:
A cooling system comprising:
a payload refrigeration unit having a set of payload cooling components that operate to cool a payload;
a control refrigeration unit having a set of control circuit cooling components a control circuit; and
a signal interface connecting the payload located in the payload refrigeration unit to the control circuit located in control refrigeration unit.

Clause 2:
The cooling system according to clause 1 further comprising:
a set of payload refrigeration units having a set of corresponding payloads, wherein the signal interface connects the set of corresponding payloads located in the set of payload refrigeration units to the control circuit in the payload refrigeration unit.

Clause 3:
The cooling system according to one of clauses 1 or 2, wherein a first temperature in the payload refrigeration unit is about 10 mK and a second temperature in the control refrigeration unit is in a temperature range from about 2 K to about room temperature.

Clause 4:
The cooling system according to one of clauses 1, 2, or 3 further comprising:
a loading chamber having an aperture connected to the payload refrigeration unit.

Clause 5:
The cooling system according to clause 4, wherein an environment in the loading chamber is adjusted to a set of desired values for a set of parameters prior at least one of opening the aperture and moving the payload from the payload refrigeration unit into the loading chamber, opening the aperture and moving the payload from the loading chamber into the payload refrigeration unit, or removing the payload from the loading chamber.

Clause 6:
The cooling system according to one of clauses according to one of clauses 1, 2, 3, 4, or 5 further comprising:
a loading chamber having an aperture connected to the control refrigeration unit.

Clause 7:
The cooling system according to clause 6, wherein an environment in the loading chamber is adjusted to a set of desired values for a set of parameters prior at least one of opening the aperture and moving the control circuit from the control refrigeration unit into the loading chamber, opening the aperture and moving the control circuit from the loading chamber into the control refrigeration unit, or removing the control circuit from the loading chamber.

Clause 8:
The cooling system according to one of clauses according to one of clauses 1, 2, 3, 4, 5, 6, or 7, wherein the payload refrigeration unit comprises:
a payload enclosure; and
wherein the set of payload cooling components comprises:
a dilution cooler in the payload enclosure, wherein the dilution cooler cools the payload when the payload is thermally connected to the dilution cooler within the payload enclosure.

Clause 9:
The cooling system according to clause 8, wherein the payload enclosure is vacuumable.

Clause 10:
The cooling system according to one or clauses 8 or 9, wherein set of payload cooling components further comprises:
a set of coolers that cool an interior of the payload enclosure.

Clause 11:
The cooling system according to one clauses 8,9, or 10, wherein the control refrigeration unit comprises:
a control enclosure configured to receive the control circuit within the control enclosure; and
wherein the set of control circuit cooling components comprises:
a set of coolers that cool the control circuit located within the control enclosure.

Clause 12:
The cooling system according to clause 11, wherein the control enclosure is vacuumable.

Clause 13:
The cooling system according to one of clauses according to one of clauses 1, 2, 3, 4, 5, 6, 7, 8, 9, 10, 11, or 12, wherein the payload is selected from at least one of a quantum computing circuit, a quantum computing chip, a superconducting circuit, a sensor system and a low temperature material, a superconducting material, an infra-red imaging system, or a topological material with electronic properties that are distinct between a surface of the topological material and an interior of topological material and a sensor system.

Clause 14:
A cryogenic cooling system comprising:
a payload refrigeration unit comprising:
a payload enclosure; and
a dilution cooler within the payload enclosure, wherein the dilution cooler cools a payload when the payload is thermally connected to the dilution cooler and is located within the payload enclosure; and
a control refrigeration unit comprising:
a control enclosure; and
a set of coolers connected to the control enclosure, wherein the set of coolers cools a control circuit when the control circuit is thermally connected to the set of coolers and is located within the control enclosure; and
a signal interface connecting the control circuit to the payload, enabling signals to be exchanged between the control circuit and the payload during an operation of the control circuit.

Clause 15:
The cryogenic cooling system according to clause 14, wherein the set of coolers is a set of first coolers further comprising:
a set of second coolers connected to the payload enclosure, wherein the set of second coolers is a first stage cooler that cools an interior of the payload enclosure to 2 Kelvin and the dilution cooler is a second stage cooler that cools the payload to 10 milli Kelvin.

Clause 16:
The cryogenic cooling system according to clause 15 further comprising:
a loading chamber having an aperture in communication with the payload enclosure.

Clause 17:
The cryogenic cooling system according to clause 16, wherein an environment in the loading chamber is adjusted to a set of desired values for a set of parameters prior at least one of opening the aperture and moving the payload from the payload enclosure into the loading chamber, opening the aperture and moving the payload from the loading chamber into the payload enclosure, or removing the payload from the loading chamber.

Clause 18:

The cryogenic cooling system according to clause 17, wherein the set of parameters is selected from at least one of temperature, a vacuum, or a pressure.

Clause 19:

The cryogenic cooling system of according to one of clauses 14, 15, 16, 17, or 18 further comprising:
  a loading chamber having an aperture in communication with the control enclosure.

Clause 20:

The cryogenic cooling system according to clause 19, wherein an environment in the loading chamber is adjusted to a set of desired values for a set of parameters prior at least one of opening the aperture and moving the control circuit from the control enclosure into the loading chamber, opening the aperture and moving the control circuit from the loading chamber into the control enclosure, or removing the control circuit from the loading chamber.

Clause 21:

The cryogenic cooling system according to clause 20, wherein the set of parameters is selected from at least one of a temperature, a vacuum, or a pressure.

Clause 22:

The cryogenic cooling system according to one of clauses 14, 15, 16, 17, 18, 19, 20, or 21, wherein the dilution cooler cools the payload to 10 milli K and wherein the set of coolers cools the control circuit in a temperature range from about 2 K to about room temperature.

Clause 23:

The cryogenic cooling system according to one of clauses 14, 15, 16, 17, 18, 19, 20, 21, or 22, wherein the payload enclosure and the control enclosure are vacuumable.

Clause 24:

The cryogenic cooling system according to one of clauses 14, 15, 16, 17, 18, 19, 20, 21, 22, or 23 further comprising:
  a first radiation shield located within the payload refrigeration unit;
  a second radiation shield located within the first radiation shield in the payload refrigeration unit;
  a third radiation shield located within the control refrigeration unit; and
  a fourth radiation shield located within the third radiation shield in the control refrigeration unit.

Clause 25:

The cryogenic cooling system according to one of clauses 14, 15, 16, 17, 18, 19, 20, 21, 22, 23, or 24 further comprising:
  a housing, wherein the control circuit is located within the housing, the housing is sealed, and helium is located within the housing.

Clause 26:

The cryogenic cooling system according to one of clauses 14, 15, 16, 17, 18, 19, 20, 21, 22, 23, 24, or 25 further comprising:
  a set of dilution coolers that cools at least one of the payload or a set of payloads.

Clause 27:

The cryogenic cooling system according to one of clauses 14, 15, 16, 17, 18, 19, 20, 21, 22, 23, 24, 25, or 26 further comprising:
  a set of refrigeration units having a set of dilution coolers that cool a set of corresponding payloads in the set of refrigeration units, wherein the set of corresponding payloads is connected to the control circuit using the signal interface.

Clause 28:

The cryogenic cooling system according to one of clauses 15, 16, 17, 18, 19, 20, 21, 22, 23, 24, 25, or 26, wherein the set of first coolers and the set of second coolers are selected from at least one of a pulse tube cooler, a Stirling cooler, a Gifford-McMahon (GM) cooler, a Joule-Thomson (JT) cooler, a liquid helium heat exchanger, or a supercritical liquid cooler.

Clause 29:

The cryogenic cooling system according to one of clauses 14, 15, 16, 17, 18, 19, 20, 21, 22, 23, 24, 25, 26, 27, or 28, wherein the payload is selected from at least one of a quantum computing circuit, a quantum computing chip, a superconducting circuit, a sensor system and a low temperature material, a superconducting material, or an infra-red imaging system, or a topological material with electronic properties that are distinct between a surface of the topological material and an interior of topological material and a sensor system.

Clause 30:

A method for controlling a quantum circuit environment, the method comprising:
  operating a set of quantum circuits in a payload refrigeration unit comprising a payload enclosure and a dilution cooler within the payload enclosure, wherein the set of quantum circuits is thermally connected to the dilution cooler;
  cooling the set of quantum circuits in the payload refrigeration unit during operation of the set of quantum circuits using the dilution cooler;
  operating a control circuit in a control refrigeration unit comprising a control enclosure and a set of coolers connected to the control enclosure, wherein the control circuit is thermally connected to set of coolers within the control enclosure and operates to control the set of quantum circuits; and
  cooling the control circuit in the control refrigeration unit during an operation of the control circuit using the set of coolers.

Clause 31:

The method according to clause 30 further comprising:
  exchanging signals between the control circuit and the set of quantum circuits through a superconductor electronic interface.

Clause 32:

The method according to one of clauses 30 or 31 further comprising:
  moving the set of quantum circuits into a loading chamber connected to the payload enclosure, where in the loading chamber has an aperture;
  adjusting an environment in the loading chamber to a set of desired values for a set of parameters while the aperture is closed;
  opening the aperture in the loading chamber in response to the environment in the loading chamber having the set of desired values for the set of parameters;
  moving the set of quantum circuits through the aperture into the payload enclosure in response to the aperture being opened: and
  connecting the set of quantum circuits to a signal interface after moving the set of quantum circuits into the payload enclosure.

Clause 33:
The method according to clause 32, wherein the set of parameters comprises at least one of a temperature, a vacuum, or a pressure.

Clause 34:
The method according to one of clauses 30, 31, 32, or 33 further comprising:
 opening an aperture in a loading chamber connected to the payload enclosure by the aperture;
 moving the set of quantum circuits out of the payload enclosure through the aperture in the loading chamber in response to the aperture being opened;
 closing the aperture in response to the set of quantum circuits being moved out of the payload enclosure through the aperture in the loading chamber; and
 moving the set of quantum circuits out of the loading chamber after the aperture is closed.

Clause 35:
The method according to clause 34 further comprising:
 adjusting an environment in the loading chamber to a set of desired values for a set of parameters prior to removing the set of quantum circuits from the loading chamber.

Clause 36:
The method according to clause 35, wherein the set of parameters comprises at least one of a temperature, a vacuum, or a pressure.

Clause 37:
The method according to one of clauses 30, 31, 32, 33, 34, 35, or 36 further comprising:
 moving the control circuit into a loading chamber connected to the control enclosure, wherein an aperture is between the control circuit and the control enclosure;
 adjusting an environment in the loading chamber to a set of desired values for a set of parameters while the aperture is closed;
 opening the aperture in response to the environment in the loading chamber having the set of desired values for the set of parameters; and
 moving the control circuit into the control enclosure in response to the aperture been opened; and
 connecting the control circuit to a signal interface after moving the control circuit through the aperture into the control enclosure.

Clause 38:
The method according to clause 37, wherein the set of parameters comprises at least one of a temperature or a vacuum.

Clause 39:
The method according to one of clauses 30, 31, 32, 33, 34, 35, 36, 37, or 38 further comprising:
 opening an aperture in a loading chamber connected to the control enclosure;
 moving the control circuit out of the control enclosure through the aperture into the loading chamber in response to the aperture being open; and
 closing the aperture in response to the control circuit being moved out of the control enclosure through the aperture in the loading chamber;
 moving the control circuit out of the loading chamber after the aperture is closed.

Clause 40:
The method according to clause 39 further comprising:
 adjusting an environment in the loading chamber to a set of desired values for a set of parameters prior to removing the control circuit from the loading chamber.

Clause 41:
The method according to clause 40, wherein the set of parameters comprises at least one of a temperature or a vacuum.

Thus, illustrative examples provide a method, apparatus, and system for cooling components. This cooling can be performed in which the different components operated in a cryogenic environment in which further temperatures such as those at or below hundred 120 K, which is about −153 degrees C. include a cooling system comprising a payload refrigeration unit, control refrigeration unit, and a signal interface. The payload refrigeration unit has a set of payload cooling components that operate to cool a payload. The control refrigeration unit has a set of control circuit cooling components a control circuit. The signal interface connecting the payload located in the payload refrigeration unit to the control circuit located in control refrigeration unit.

In one or more illustrative examples, the environment for control circuits are separate from the environment for payloads. In illustrative examples, independent control and access to control refrigeration units and payload refrigeration units can increase the operational capacity of the cooling system. Further, with the use of components such as loading chambers, the system can insert and remove components, such as a control circuit or a payload, in a manner that enables the components to have environment close to that within the refrigeration units prior to introducing these components to the refrigeration units. In this manner, cooling or warming an entire refrigeration unit can be avoided using the different illustrative examples.

The description of the different illustrative embodiments has been presented for purposes of illustration and description and is not intended to be exhaustive or limited to the embodiments in the form disclosed. The different illustrative examples describe components that perform actions or operations. In an illustrative embodiment, a component can be configured to perform the action or operation described. For example, the component can have a configuration or design for a structure that provides the component an ability to perform the action or operation that is described in the illustrative examples as being performed by the component. Further, To the extent that terms "includes", "including", "has", "contains", and variants thereof are used herein, such terms are intended to be inclusive in a manner similar to the term "comprises" as an open transition word without precluding any additional or other elements.

Many modifications and variations will be apparent to those of ordinary skill in the art. Further, different illustrative embodiments may provide different features as compared to other desirable embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. A cooling system comprising:
 a payload refrigeration unit having a set of payload cooling components that operate to cool a payload;
 a control refrigeration unit having a set of control circuit cooling components in a control circuit; and
 a signal interface connecting the payload located in the payload refrigeration unit to the control circuit located in the control refrigeration unit.

2. The cooling system of claim 1 further comprising:
 a set of payload refrigeration units having a set of corresponding payloads, wherein the signal interface connects the set of corresponding payloads located in the set of payload refrigeration units to the control circuit in the payload refrigeration unit.

3. The cooling system of claim 1, wherein a first temperature in the payload refrigeration unit is about 10 mK and a second temperature in the control refrigeration unit is in a temperature range from about 2 K to about room temperature.

4. The cooling system of claim 1 further comprising:
a loading chamber having an aperture connected to the payload refrigeration unit.

5. The cooling system of claim 4, wherein an environment in the loading chamber is adjusted to a set of desired values for a set of parameters prior at least one of opening the aperture and moving the payload from the payload refrigeration unit into the loading chamber, opening the aperture and moving the payload from the loading chamber into the payload refrigeration unit, or removing the payload from the loading chamber.

6. The cooling system of claim 1 further comprising:
a loading chamber having an aperture connected to the control refrigeration unit.

7. The cooling system of claim 6, wherein an environment in the loading chamber is adjusted to a set of desired values for a set of parameters prior at least one of opening the aperture and moving the control circuit from the control refrigeration unit into the loading chamber, opening the aperture and moving the control circuit from the loading chamber into the control refrigeration unit, or removing the control circuit from the loading chamber.

8. The cooling system of claim 1, wherein the payload refrigeration unit comprises:
a payload enclosure; and
wherein the set of payload cooling components comprises:
a dilution cooler in the payload enclosure, wherein the dilution cooler cools the payload when the payload is thermally connected to the dilution cooler within the payload enclosure.

9. The cooling system of claim 8, wherein set of payload cooling components further comprises:
a set of coolers that cool an interior of the payload enclosure.

10. The cooling system of claim 8, wherein the control refrigeration unit comprises:
a control enclosure configured to receive the control circuit within the control enclosure; and
wherein the set of control circuit cooling components comprises:
a set of coolers that cool the control circuit located within the control enclosure.

11. The cooling system of claim 10, wherein the control enclosure is vacuumable.

12. The cooling system of claim 1, wherein the payload is selected from at least one of a quantum computing circuit, a quantum computing chip, a superconducting circuit, a sensor system and a low temperature material, a superconducting material, an infra-red imaging system, or a topological material with electronic properties that are distinct between a surface of the topological material and an interior of topological material and a sensor system.

13. A cryogenic cooling system comprising:
a payload refrigeration unit comprising:
a payload enclosure; and
a dilution cooler within the payload enclosure, wherein the dilution cooler cools a payload when the payload is thermally connected to the dilution cooler and is located within the payload enclosure; and
a control refrigeration unit comprising:
a control enclosure; and
a set of coolers connected to the control enclosure, wherein the set of coolers cools a control circuit when the control circuit is thermally connected to the set of coolers and is located within the control enclosure; and
a signal interface connecting the control circuit to the payload, enabling signals to be exchanged between the control circuit and the payload during an operation of the control circuit.

14. The cryogenic cooling system of claim 13, wherein the set of coolers is a set of first coolers further comprising:
a set of second coolers connected to the payload enclosure, wherein the set of second coolers is a first stage cooler that cools an interior of the payload enclosure to 2 Kelvin and the dilution cooler is a second stage cooler that cools the payload to 10 milli Kelvin.

15. The cryogenic cooling system of claim 13 further comprising:
a set of dilution coolers that cools at least one of the payload or a set of payloads.

16. The cryogenic cooling system of claim 13 further comprising:
a set of refrigeration units having a set of dilution coolers that cool a set of corresponding payloads in the set of refrigeration units, wherein the set of corresponding payloads is connected to the control circuit using the signal interface.

17. A method for controlling a quantum circuit environment, the method comprising:
operating a set of quantum circuits in a payload refrigeration unit comprising:
a payload enclosure; and
a dilution cooler within the payload enclosure, wherein the set of quantum circuits is thermally connected to the dilution cooler;
cooling the set of quantum circuits in the payload refrigeration unit during operation of the set of quantum circuits using the dilution cooler;
operating a control circuit in a control refrigeration unit comprising:
a control enclosure; and
a set of coolers connected to the control enclosure, wherein the control circuit is thermally connected to a set of coolers within the control enclosure and operates to control the set of quantum circuits; and
cooling the control circuit in the control refrigeration unit during an operation of the control circuit using the set of coolers.

18. The method of claim 17 further comprising:
exchanging signals between the control circuit and the set of quantum circuits through a superconductor electronic interface.

19. The method of claim 17 further comprising:
moving the set of quantum circuits into a loading chamber connected to the payload enclosure, where in the loading chamber has an aperture;
adjusting an environment in the loading chamber to a set of desired values for a set of parameters while the aperture is closed;
opening the aperture in the loading chamber in response to the environment in the loading chamber having the set of desired values for the set of parameters;

moving the set of quantum circuits through the aperture into the payload enclosure in response to the aperture being opened; and connecting the set of quantum circuits to a signal interface after moving the set of quantum circuits into the payload enclosure.

20. The method of claim 17 further comprising:

moving the control circuit into a loading chamber connected to the control enclosure, wherein an aperture is between the control circuit and the control enclosure;

adjusting an environment in the loading chamber to a set of desired values for a set of parameters while the aperture is closed;

opening the aperture in response to the environment in the loading chamber having the set of desired values for the set of parameters;

moving the control circuit into the control enclosure in response to the aperture been opened; and connecting the control circuit to a signal interface after moving the control circuit through the aperture into the control enclosure.

* * * * *